(12) United States Patent
Takeuchi et al.

(10) Patent No.: US 11,662,397 B2
(45) Date of Patent: *May 30, 2023

(54) ELECTROMAGNET CONTROL DEVICE AND ELECTROMAGNET SYSTEM

(71) Applicant: EBARA CORPORATION, Tokyo (JP)

(72) Inventors: Haruka Takeuchi, Tokyo (JP); Tomonori Ohashi, Tokyo (JP); Ichiju Sato, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/659,684

(22) Filed: Apr. 19, 2022

(65) Prior Publication Data

US 2022/0236341 A1 Jul. 28, 2022

Related U.S. Application Data

(63) Continuation of application No. 16/927,311, filed on Jul. 13, 2020, now Pat. No. 11,346,896.

(30) Foreign Application Priority Data

Aug. 26, 2019 (JP) .............................. JP2019-153950

(51) Int. Cl.
*G01R 33/022* (2006.01)
*G01R 33/028* (2006.01)

(52) U.S. Cl.
CPC ....... *G01R 33/022* (2013.01); *G01R 33/0283* (2013.01)

(58) Field of Classification Search
CPC .. G01R 33/022; G01R 33/0283; G01R 33/02; G01R 33/028; G01R 33/83; G01R 33/14;

(Continued)

(56) References Cited

U.S. PATENT DOCUMENTS 9,390,943 B2 * 7/2016 Nagaseki .............. C23C 14/352
2011/0115379 A1 5/2011 Long
(Continued)

FOREIGN PATENT DOCUMENTS

CN 101390282 A 3/2009
CN 101390283 A 3/2009
(Continued)

OTHER PUBLICATIONS

International Search Report issued in Patent Application No. PCT/JP2016/063698 dated Aug. 9, 2016.
(Continued)

*Primary Examiner* — Jermele M Hollington
*Assistant Examiner* — Taqi R Nasir
(74) *Attorney, Agent, or Firm* — Pearne & Gordon LLP

(57) ABSTRACT

A target value of magnetic flux density and magnetic flux density actually obtained are made to coincide precisely with each other. An electromagnet control device comprises a current value determining unit for determining, based on a magnetic flux density instruction value, a value of current that is made to flow through a coil. The current value determining unit is constructed to execute a second process for determining, based on a second function, a value of the current, if the magnetic flux density is to be decreased from that in a first magnetization state, and a fourth process for expanding or reducing the second function by use of a first scaling ratio for transforming it to a fourth function, and determining, based on the fourth function obtained after above transformation, a value of the current, if the magnetic flux density is to be decreased from that in a third magnetization state.

4 Claims, 16 Drawing Sheets

(58) Field of Classification Search
CPC ............. H01J 37/32431; H01J 37/3266; H01J 37/32669
See application file for complete search history.

(56) References Cited

U.S. PATENT DOCUMENTS

| | | | |
|---|---|---|---|
| 2011/0309906 A1 | 12/2011 | Muneuchi et al. | |
| 2014/0206199 A1 | 7/2014 | Himori et al. | |
| 2014/0346040 A1 | 11/2014 | Yokota et al. | |
| 2018/0114678 A1* | 4/2018 | Ohashi | C23C 14/3407 |
| 2019/0326091 A1* | 10/2019 | Takeuchi | H01F 7/20 |

FOREIGN PATENT DOCUMENTS

| | | |
|---|---|---|
| CN | 102364619 A | 2/2012 |
| CN | 102577631 A | 7/2012 |
| JP | S54-090492 A | 7/1979 |
| JP | S60-098822 A | 6/1985 |
| JP | S63-162866 A | 7/1988 |
| JP | H02-195294 A | 8/1990 |
| JP | H05-267237 A | 10/1993 |
| JP | H06-335226 A | 12/1994 |
| JP | H07-072277 A | 3/1995 |
| JP | H08-321423 A | 12/1996 |
| JP | 2001-165343 A | 6/2001 |
| JP | 2002-164229 A | 6/2002 |
| JP | 2007-132902 A | 5/2007 |
| JP | 2012-074972 A | 4/2012 |
| JP | 2012-149618 A | 8/2012 |
| JP | 2013-102098 A | 5/2013 |
| JP | 2013-149722 A | 8/2013 |
| JP | 5501181 B2 | 5/2014 |
| JP | 2014-158005 A | 8/2014 |
| JP | 2015-011836 A | 1/2015 |
| JP | 2017-084563 A | 5/2017 |
| KR | 10-2007-0015937 A | 2/2007 |
| KR | 10-2009-0075908 A | 7/2009 |
| KR | 10-2012-0125187 A | 11/2012 |
| WO | 2005/118907 A1 | 12/2005 |

OTHER PUBLICATIONS

Written Opinion issued in Patent Application No. PCT/JP2016/063698 dated Aug. 9, 2016.

* cited by examiner

Fig. 14

| Hysteresis data measurement interval | Magnetic flux density step width | σ (Standard deviation) | 3σ | Average value |
|---|---|---|---|---|
| 3G interval | 1G | 0.033 | 0.100 | -0.004 |
| | 3G | 0.024 | 0.071 | -0.005 |
| | 6G | 0.025 | 0.075 | 0.000 |
| | 9G | 0.035 | 0.106 | 0.007 |
| 6G interval | 1G | 0.039 | 0.118 | -0.012 |
| | 3G | 0.029 | 0.086 | -0.009 |
| | 6G | 0.018 | 0.054 | -0.012 |
| | 9G | 0.022 | 0.066 | -0.007 |
| 10G interval | 1G | 0.072 | 0.215 | -0.006 |
| | 3G | 0.059 | 0.177 | -0.007 |
| | 6G | 0.043 | 0.128 | -0.015 |
| | 9G | 0.029 | 0.086 | -0.017 |

Fig. 16

| Transition time per unit current (ms/A) | 3σ |
|---|---|
| 100 | 0.072 |
| 90 | 0.074 |
| 80 | 0.089 |
| 70 | 0.109 |
| 60 | 0.111 |
| 50 | 0.130 |
| 40 | 0.151 |
| 30 | 0.189 |

ELECTROMAGNET CONTROL DEVICE AND ELECTROMAGNET SYSTEM

CROSS-REFERENCE TO RELATED APPLICATIONS

This application is a Continuation application of application Ser. No. 16/927,311, filed Jul. 13, 2020, which claims the benefit of Japanese Application No. 2019-153950, filed Aug. 26, 2019, the entire disclosures of which are hereby incorporated herein by reference.

TECHNICAL FIELD

The present invention relates to the technique for controlling current flowing through a coil of an electromagnet comprising a yoke and the coil.

BACKGROUND ART

In a plasma processing device (for example, a plasma etching device and so on) in prior art, an etching method using magnetron discharge has been developed to be practically used. The above method is that for efficiently etching a surface of a wafer, in a chamber into which an etching gas is introduced, by applying an electric field in a direction and a magnetic field in another direction that are orthogonal to each other, and using drift motion of electrons that occurs when the above fields are applied.

In such an etching device, for controlling distribution of plasma density in a chamber, the generated magnetic field is controlled by a magnet positioned outside the chamber. Regarding methods for controlling magnetic fields, a method in which a permanent magnet is mechanically moved and a method in which current applied to an electromagnet is controlled have been known, for example. In the method in which a permanent magnet is mechanically moved, it is difficult to finely adjust plasma density distribution, since strength of the magnetic field generated by the permanent magnet is fixed. Accordingly, in prior art, a method in which current applied to an electromagnet is controlled has been adopted.

On the other hand, regarding an electromagnet, it has been known that magnetic hysteresis (hereinafter, this is simply referred to as "hysteresis") exists between the controlled current applied to the electromagnet and the generated magnetic flux density. That is, since the magnetic flux density obtained as a result of application of current to the electromagnet is affected by a residual magnetic field, it may not be always true that the same magnetic flux density value is reproduced when the same current is applied.

One of methods for reducing the effect of residual magnetism, such as that explained above, is a method in which a current value is corrected by taking a hysteresis characteristic into consideration (for example, the Patent Literature 1 listed below).

CITATION LIST

Patent Literature

PTL 1: Japanese Patent Application Public Disclosure No. 2017-084563

SUMMARY OF INVENTION

Technical Problem

There is a demand that a target value of a magnetic flux density and a magnetic flux density actually obtained be made to coincide precisely with each other.

Solution to Problem

The present invention has been made to solve at least part of the above problem, and can be realized as the following embodiments.

According to a first mode of the present invention, an electromagnet control device for controlling current flowing through a coil of an electromagnet comprising a yoke and the coil is provided, and the electromagnet control device comprises:

an instruction value obtaining unit constructed for obtaining a magnetic flux density instruction value corresponding to a target value of a magnetic flux density that is obtained by making current flow through the coil, or obtaining information by which the magnetic flux density instruction value can be specified;

a current value determining unit for determining, based on the magnetic flux density instruction value, a value of current that is made to flow through the coil;

a storage unit for storing first, second, and third functions that are based on measured data of hysteresis of the electromagnet; and a driver for applying current, that has a step waveform or a ramp waveform, to the coil in accordance with the determined value of current:

wherein the current value determining unit is constructed to execute a first process for determining, based on the first function, a value of current that is made to flow through the coil, in the case that the magnetic flux density is to be increased from that when the yoke is in a demagnetization state;

a second process for determining, based on the second function, a value of current that is made to flow through the coil, in the case that the magnetic flux density is to be decreased from that when the yoke is in a first magnetization state;

a third process for determining, based on the third function, a value of current that is made to flow through the coil, in the case that the magnetic flux density is to be increased from that when the yoke is in a second magnetization state;

a fourth process for expanding or reducing the second function by use of a first scaling ratio for transforming it to a fourth function, and determining, based on the fourth function obtained after above transformation, a value of current that is made to flow through the coil, in the case that the magnetic flux density is to be decreased from that when the yoke is in a third magnetization state; and a fifth process for expanding or reducing the third function by use of a second scaling ratio for transforming it to a fifth function, and determining, based on the fifth function obtained after above transformation, a value of current that is made to flow through the coil, in the case that the magnetic flux density is to be increased from that when the yoke is in a fourth magnetization state: and the current value determining unit is constructed to
determine, in the fourth process, the first scaling ratio in such a manner that the second function fits measured data that are obtained in advance by decreasing the magnetic flux density from that in the third magnetization state; and
determine, in the fifth process, the second scaling ratio in such a manner that the third function fits measured data that are obtained in advance by increasing the magnetic flux density from that in the fourth magnetization state.

According to the above electromagnet control device, three functions are used in different ways to correspond to history of application of current, to thereby control current that is made to flow through the coil; so that, irrespective of the history of application of current, effect of residual magnetism due to hysteresis can be reduced, and a magnetic flux density instruction value and a magnetic flux density value, that is actually obtained by making current flow through the coil, can be made to coincide with each other more precisely, compared with that in the case in prior art. As a result, regarding a plasma processing device comprising the above electromagnet control device, reproducibility with respect to a condition of use of a process, when a same plasma processing device is used, can be improved, and individual differences between plasma processing devices having same specifications can be reduced. Further, a magnetic flux density instruction value and an actually obtained magnetic flux density value can be made to coincide precisely with each other, regardless of the magnitude of hysteresis that the yoke has. Thus, it is not required to use, as a material of the yoke, a material having small hysteresis. Accordingly, a material, which can be easily obtained and is inexpensive, can be used as a material of the yoke. That is, costs relating to the electromagnet control device, and time required from the point in time when the electromagnet control device is ordered to the point in time when the electromagnet control device is delivered can be reduced.

Further, according to the above electromagnet control device, the device has a construction that the fourth function and the fifth function are obtained by expanding or reducing the second function and the third function by use of scaling ratios based on measured data, respectively; thus, an actual magnetic flux density generated based on a controlled current value determined in accordance with each of the fourth function and the fifth function can be made to coincide precisely with a magnetic flux density instruction value.

According to a second mode of the present invention, the second mode comprises the first mode, wherein a step width of current having the step waveform is set in such a manner that a step width, that is obtained by converting the above step width to magnetic flux, is equal or close to an interval of magnetic flux densities at the time when the measured data of hysteresis of the electromagnet are obtained.

According to the above mode, a magnetic flux density instruction value and an actual magnetic flux density generated by the electromagnet can be made to more precisely coincide with each other.

According to a third mode of the present invention, the third mode comprises the first mode, wherein the first function, the second function, and the third function are functions representing relationship between magnetic flux density and current. According to the above mode, current that is made to flow through the coil can be determined directly from a desired magnetic flux density, without necessity of conversion to another parameter. Thus, load relating to computation in the electromagnet control device can be reduced.

According to a fourth mode of the present invention, an electromagnet system comprising the electromagnet control device according to the first mode and the electromagnet is provided. According to the above electromagnet system, effect similar to that obtainable from the first mode can be obtained.

The present invention is not limited to the above modes, and can be implemented as various modes such as a method for controlling an electromagnet, a program for controlling an electromagnet, a storage medium which records the program in a manner that the program is readable by a computer, and so on.

BRIEF DESCRIPTION OF DRAWINGS

FIG. 14 is an example of result of evaluation with respect to dispersion of deviations ΔB of magnetic flux density generated by electromagnet, in the case that current outputted from a driver has a step waveform.

FIG. 16 is an example of result of evaluation with respect to dispersion of deviations ΔB of magnetic flux density generated by an electromagnet, in the case that current outputted from a driver has a ramp waveform.

DESCRIPTION OF EMBODIMENTS

A. First Embodiment

Figure 1:
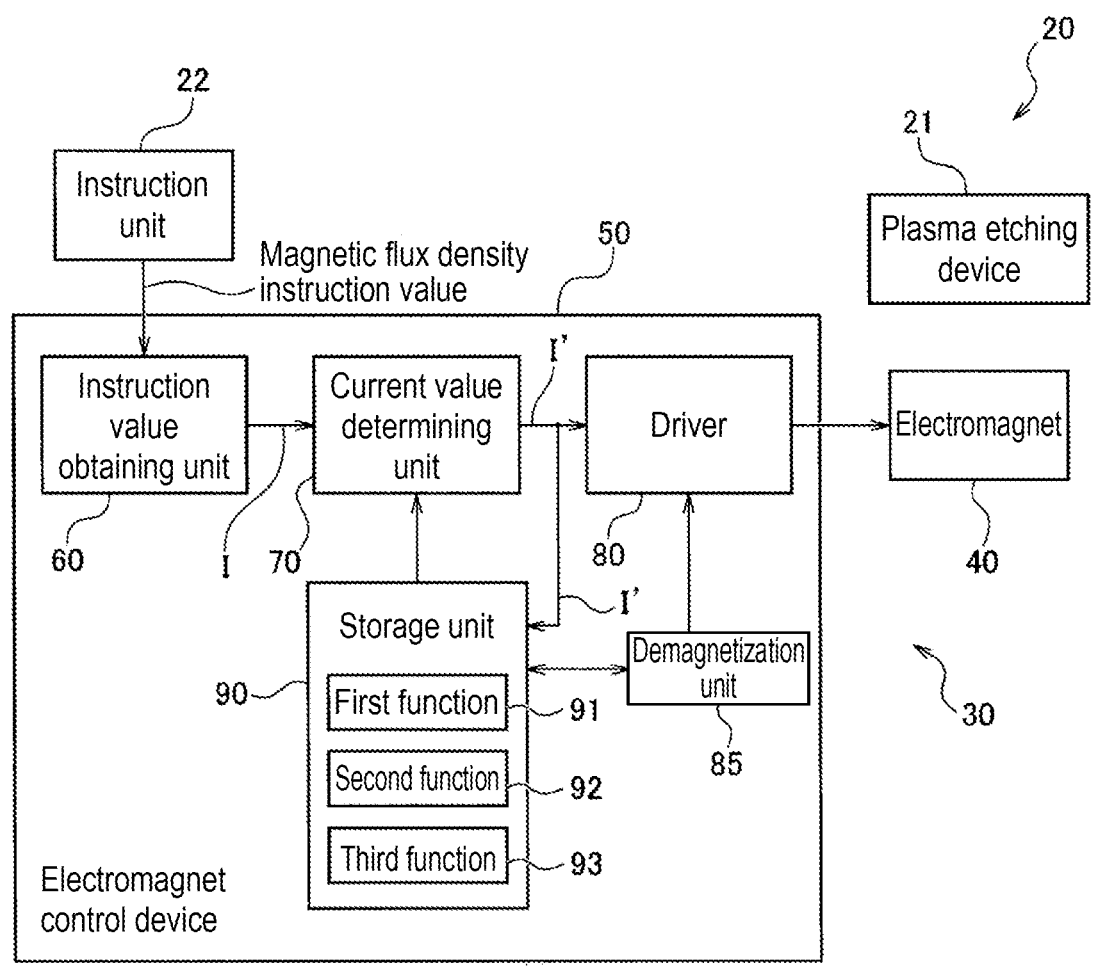
FIG. 1 is a block diagram which schematically shows a construction of a plasma etching system which is selected as an embodiment of the present invention.

FIG. 1 is a block diagram which schematically shows a construction of a plasma processing system 20 which is selected as an embodiment of the present invention. In the present embodiment, the plasma processing system 20 is a system for performing plasma etching, and used for etching a substrate (for example, a wafer) in a semiconductor manufacturing process, for example. As shown in FIG. 1, the plasma processing system 20 comprises a plasma etching device 21, an instruction unit 22, and an electromagnet system 30. The plasma etching device 21 comprises a chamber (a graphic representation thereof is abbreviated). Plasma is generated in the chamber, and an object of processing is etched by ions or radicals generated thereby. In the present embodiment, the instruction unit 22 is a personal computer, and connected to the electromagnet system 30 (more specifically, an electromagnet control device 50 which will be explained later) to allow communication between them. The instruction unit 22 may be any device which gives an instruction to the electromagnet system 30, so that it may be a sequencer, for example.

The electromagnet system 30 comprises an electromagnet 40 and an electromagnet control device 50. The electromagnet 40 is positioned external and adjacent to the chamber, for controlling plasma density distribution in the plasma etching device 21 by use of a magnetic field generated by the electromagnet 40. The electromagnet control device 50 receives an instruction from the instruction unit 22, and controls current, that is made to flow through the electromagnet 40, for obtaining desired magnetic flux density. The electromagnet control device 50 is constructed to be controllable in such a manner that plasma density distribution can be controlled to correspond to a state of processing in the plasma etching device 21, thus, current (in other words, magnetic flux density) can be controlled to be decreased (or decreased) before the current value reaches the predetermined maximum (or minimum) current value (in other words, a magnetic flux density value).

Figure 2:
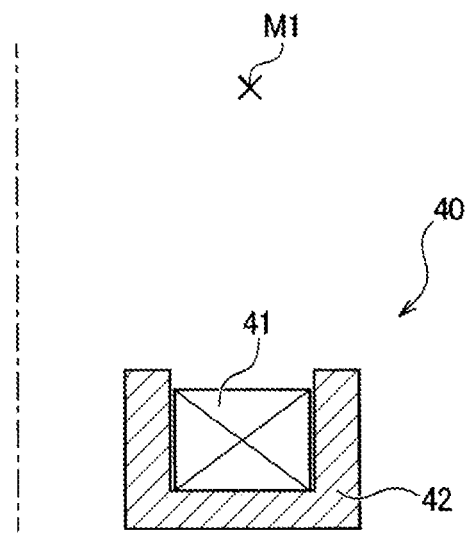
FIG. 2 is a partial sectional view which schematically shows a construction of an electromagnet.

FIG. 2 is a sectional view which schematically shows a construction of the electromagnet 40. The electromagnet 40 comprises a coil 41 and a yoke 42. For simplifying explanation, it is supposed in the present embodiment that the electromagnet 40 comprises a single coil 41. In this regard, it should be reminded that the electromagnet 40 may comprise any number of coils 41. The coil 41 is arranged to have a circular form in the view from the top; however, in FIG. 2, only a side part about the center of the circle is shown. In the electromagnet 40, current, that is to be made to flow through the coil 41, is controlled in such a manner that desired magnetic flux density is obtained at a measurement point M1 (a point within the chamber) that is spaced apart by a predetermined distance from the coil 41.

However, the yoke 42 constructed by use of magnetic material has magnetic hysteresis. Thus, in the case that current, that is made to flow through the coil 41, is calculated based on desired magnetic flux density (a magnetic flux density instruction value inputted from the instruction unit 22, in the present embodiment) in a simple manner, a difference between the desired magnetic flux density and the magnetic flux density measured at the measurement point M1, that depends on history of current applied to the coil 41, arises. The electromagnet control device 50 has a function to reduce such effect due to hysteresis (that is, inconsistency between the desired magnetic flux density and the magnetic flux density measured at the measurement point M1).

As shown in FIG. 1, the electromagnet control device 50 comprises an instruction value obtaining unit 60, a current value determining unit 70, a driver 80, a demagnetization unit 85, and a storage unit 90. The instruction value obtaining unit 60 receives a magnetic flux density instruction value from the instruction unit 22. Further, the instruction value obtaining unit 60 converts the received magnetic flux density instruction value to a current value of current that is made to flow through the coil 41, in the case that it is supposed that no hysteresis exists (i.e., in the case that it is supposed that the current that is made to flow through the coil 41 and the magnetic flux density measured at the measurement point M1 are proportional to each other). The thus converted current value is also referred to as a current instruction value I. The instruction value obtaining unit 60 outputs the calculated current instruction value I to the current value determining unit 70.

The current value determining unit 70 corrects a current instruction value I by taking the hysteresis of the electromagnet 40 into consideration, and determines a value of current (this is also referred to as a controlled current value I') that is made to actually flow through the coil 41. The above processing is performed based on a first function 91, a second function 92, and a third function 93. These functions are stored in the storage unit 90 in advance. In this regard, note that these functions may be obtained from the outside (for example, the instruction unit 22) by communication. Also, as will be explained later, there may be a case that each of the second function 92 and the third function 93 may be transformed to correspond to a state; and, in this regard, the current value determining unit 70 may obtain a function, which has been transformed, form the outside by communication. Details with respect to these functions will be explained later.

Thereafter, the current value determining unit 70 outputs the determined controlled current value I' to the driver 80. The driver 80 controls supply of current to the coil 41. That is, the driver 80 makes current having the inputted controlled current value I' flow through the coil 41 of the electromagnet 40. The demagnetization unit 85 performs demagnetization with respect to the yoke 42. Specifically, in the present embodiment, the demagnetization unit 85 obtains, from the storage unit 90 after receiving a demagnetization instruction from the instruction unit 22, parameters (for example, amplitude, a frequency, etc., for AC demagnetization) to be used for demagnetization. Thereafter, the demagnetization unit 85 outputs an instruction according to the obtained parameters to the driver 80. The driver 80 converts, based on the inputted instruction, the current to have a desired waveform.

Figure 3:
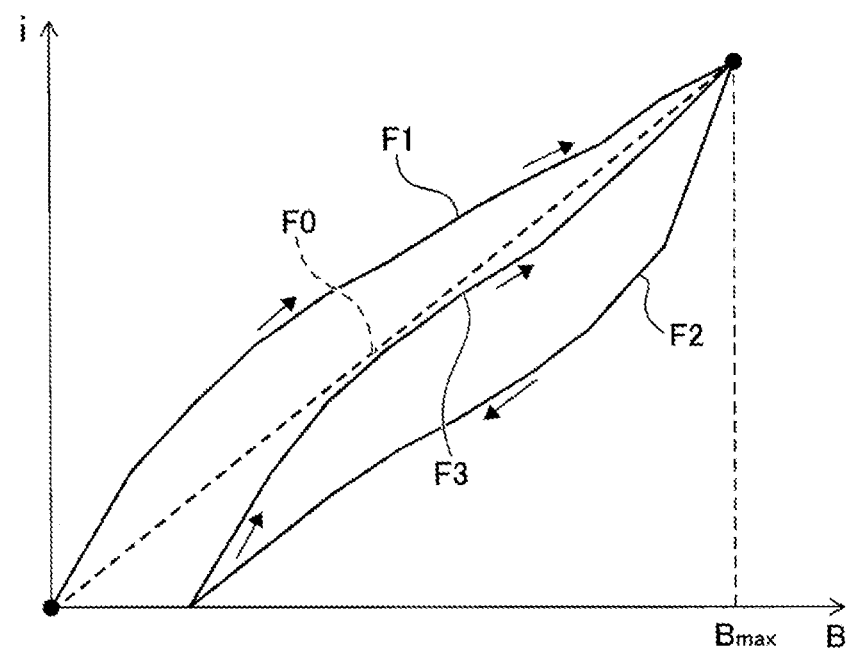
FIG. 3 is a figure used for explaining a concept for determining, based on functions, current values.

FIG. 3 is a figure used for explaining a concept for determining the controlled current value I' based on the first function 91, the second function 92, and the third function 93. An ideal straight line F0 shows ideal relationship (i.e., relationship when no hysteresis exists) between the current that is made to flow through the coil 41 and the magnetic flux density obtained by as a result of flow of the current. In the case of the ideal straight line F0, proportional relation exists between the current and the magnetic flux density, wherein, in the proportional relation, the ideal straight line F0 passes through the origin. On the other hand, each of a first function line F1, a second function line F2, and a third function line F3 represents, in a conceptual manner, relationship between the current and the magnetic flux density after correction processing that takes effect of hysteresis into consideration. It should be reminded that the first function line F1, the second function line F2, and the third function line F3 shown in FIG. 3 are not those constructed by simply converting the first function 91, the second function 92, and the third function 93, as they stand, to the forms of graphs, and they are those showing, in a conceptual manner, how the current instruction values I are corrected by use of the respective functions and in relation to the ideal straight line F0. The first function line F1 is positioned above the ideal straight line F0. The second function line F2 is positioned below the ideal straight line F0, and the third function line F3 is positioned above the second function line F2. In the example shown in FIG. 3, the whole part of the third function line F3 is positioned below the ideal straight line F0; however, depending on the material of the yoke 42, a part of the third function line F3 may be positioned above the ideal straight line F0.

Regarding the function lines F1-F3, a hysteresis characteristic of the electromagnet 40 is actually measured in advance, and, based on result of the actual measurement, the function lines F1-F3 are defined in an approximation manner. The first function 91, the second function 92, and the third function 93 are defined in an approximation manner, so as to be able to obtain, as controlled current values I', the current values on the defined function lines F1-F3. In the present embodiment, each of the first function 91, the second function 92, and the third function 93 is defined as a piecewise linear function. That is, in the case that each of the first function 91, the second function 92, and the third function 93 is converted to a form of a graph, the graph has a form wherein plural line shapes are connected via break points. In this regard, note that each of the first function 91, the second function 92, and the third function 93 may be defined as a simple linear function, with respect to which sections are not defined, or may be defined as any function.

The first function 91 is used in the case that the magnetic flux density is to be increased from that when the yoke 42 is in a demagnetization state. The first function line F1 in FIG. 3, which corresponds to the first function 91, is defined in the section between the origin and the maximum value $B_{max}$ of the magnetic flux density. That is, the first function line F1 shown in the figure represents, in an approximation manner, relationship between the values of current flowing through the coil 41 and the magnetic flux densities obtained at the measurement point M1, in the case that current is to be increased, by constant increments, from a current value of zero to a current value corresponding to the maximum value $B_{max}$ (current value $I_{max}$).

The second function 92 is used in the case that the magnetic flux density is to be decreased from that when the yoke 42 is in a magnetization state. The second function line F2 in FIG. 3, which corresponds to the second function 92, is defined in the section between the maximum value $B_{max}$ and a point on the x axis (the current value is zero). That is, the second function line F2 shown in the figure represents, in an approximation manner, relationship between the values of current flowing through the coil 41 and magnetic flux densities obtained at the measurement point M1, in the case that current is to be decreased, by constant decrements, from a current value corresponding to the maximum value $B_{max}$ to a current value of zero.

The third function 93 is used in the case that the magnetic flux density is to be increased from that when the yoke 42 is in a magnetization state. The third function line F3 in FIG. 3, which corresponds to the third function 93, is defined in the section between a point on the x axis (the current value is zero) and the maximum value $B_{max}$. That is, the third function line F3 shown in the figure represents, in an approximation manner, relationship between the values of current flowing through the coil 41 and magnetic flux densities obtained at the measurement point M1, in the case that current is to be increased, by constant increments, to a current value corresponding to the maximum value $B_{max}$ again, after the current is decreased from current value corresponding to the maximum value $B_{max}$ to a current value of zero.

Although FIG. 3 shows the first quadrant only, it should be reminded that it is possible to obtain, in the second to fourth quadrants, graphs which are origin-symmetrical to the line shapes shown in FIG. 3, and that the first function 91, the second function 92, and the third function 93 are defined in such a manner that they correspond to the graphs.

Figure 4:
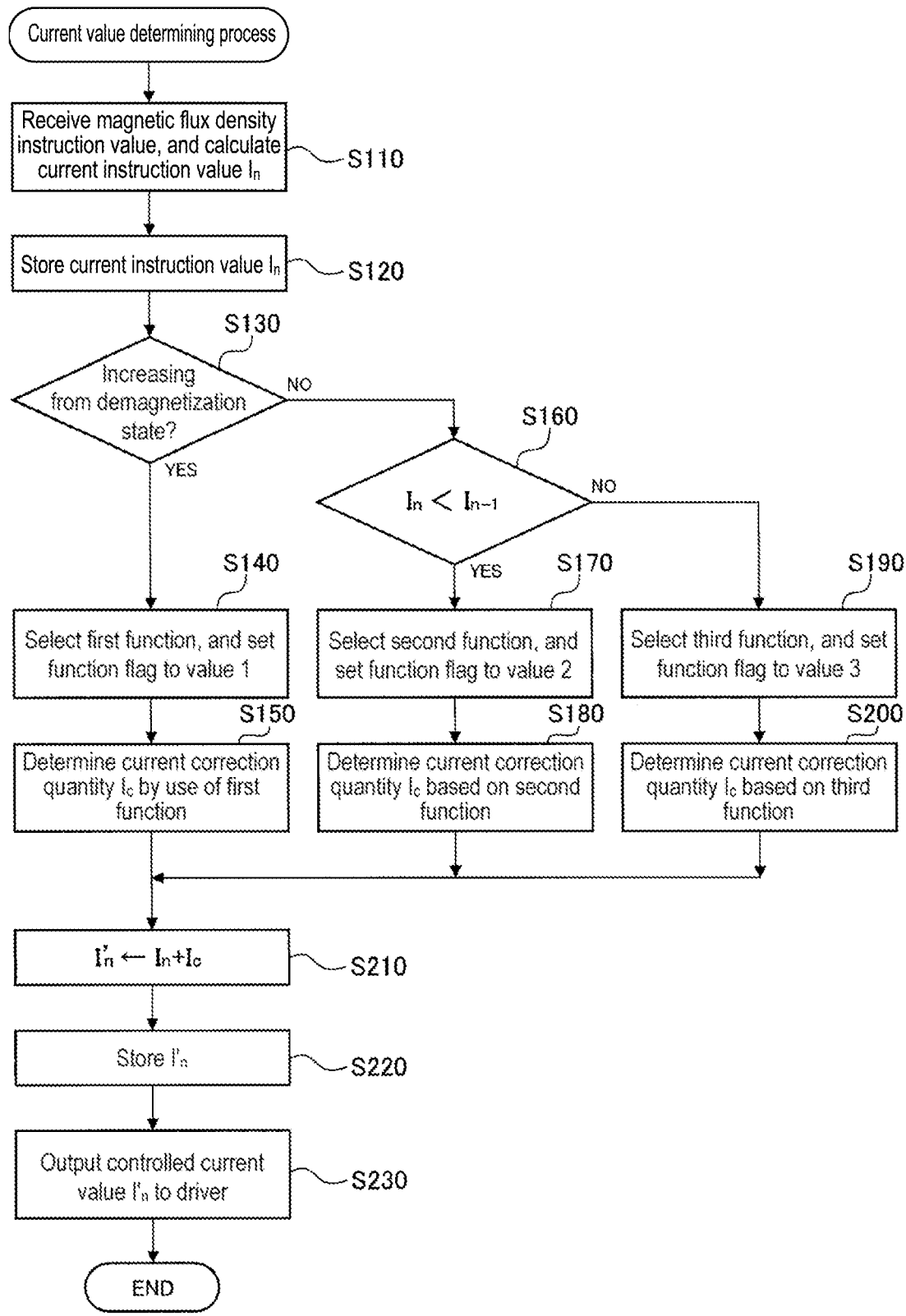
FIG. 4 is a flow chat showing the flow of a process for determining a current value.

FIG. 4 is a flowchart showing an example of flow of a current value determining process performed by the electromagnet control device 50. The current value determining process is a process for determining, based on an instruction value inputted from the instruction unit 22, a current value of current that is made to flow through the coil 41. The current value determining process is performed, in a repeat manner, every time an instruction value is inputted from the instruction unit 22 to the electromagnet control device 50. For simplifying explanation, FIG. 4 shows a case wherein each of the current value and the magnetic flux density value is controlled within a range that includes zero and values greater than zero (that is, within the range of the first quadrant shown in FIG. 3). After starring of the current value determining process, the instruction value obtaining unit 60 first receives a magnetic flux density instruction value inputted from the instruction unit 22, and calculates a current instruction value In (step S110). The suffix "n" of the current instruction value I represents a characteristic that the current instruction value I corresponds to a magnetic flux density instruction value inputted when the n-th input operation is performed. The current instruction value In is calculated based on the ideal straight line F0 shown in FIG. 3.

After calculating the current instruction value In, the instruction value obtaining unit 60 stores the calculated current instruction value In in the storage unit 90 (step S120), and outputs the current instruction value In to the current value determining unit 70. In the present embodiment, the current instruction value In stored in the storage unit 90 is deleted when a current value determining process, that is performed next time, is completed.

The current value determining unit 70 judges whether or not the inputted current instruction value In represents an instruction for increasing magnetic flux density from that in a demagnetization state (step S130). The "instruction for increasing magnetic flux density from that in a demagnetization state" in this case includes an instruction for increasing, for the first time, magnetic flux density from an initial state (i.e., no residual magnetism), and an instruction for increasing magnetic flux density at timing in a middle stage in the case that the magnetic flux density is to be increased, in a stepwise manner, from an initial state without decreasing the magnetic flux density at all. In the present embodiment, the above judgment is made based on judgment as to whether or not a current instruction value $I_{n-1}$ is stored in the last-executed step S120 of the current value determining process, and a function flag which will be explained later. It is natural that, in the case that the current value determining process is performed for the first time, the current instruction value $I_{n-1}$ has not been stored. Further, in the present embodiment, in the case that a demagnetization process is performed by the demagnetization unit 85 after performing the n-th current value determining process, the current instruction value In stored in the storage unit 90 is deleted. Thus, the current value determining unit 70 can judge whether or not an inputted current instruction value In represents increasing of magnetic flux density from an initial state for the first time, based on whether a current instruction value $I_{n-1}$ has been stored in the storage unit 90. Regarding whether or not an inputted current instruction value In represents increasing of magnetic flux density in a middle stage, it can be judged by use of a function flag which will be explained later. The above judgment will be explained later.

If it is judged as a result of judgment that the current instruction value In represents increasing of magnetic flux density from that in the demagnetization state (step S130: YES), the current value determining unit 70 selects the first function 91 and sets a function flag to a value of 1 (step S140). The function flag is written in a flag area reserved in the storage unit 90. The method for using the function flag will be explained later. Next, the current value determining unit 70 determines a current correction quantity Ic by use of the first function 91 (step S150). In the present embodiment, the first function 91 is a function representing relationship between magnetic flux density instruction values B (or current instruction values I) and current correction quantities Ic. The above matter also applies to the second function 92 and the third function 93. The method for determining the current correction quantity Ic in this case will be explained later. Next, the current value determining unit 70 adds the current correction quantity Ic to the current instruction value In calculated in above step S110 to calculate a controlled current value In' (step S210). Thereafter, the current value determining unit 70 stores the controlled current value In' in the storage unit 90 (step S220), outputs the controlled current value In' to the driver 80 (step S230), and terminates the current value determining process.

On the other hand, in the case that the current instruction value In does not represent an instruction for increasing magnetic flux density from that in the demagnetization state (step S130: NO), i.e., in the case that the yoke 42 is in a magnetization state, the current value determining unit 70 judges whether or not the current instruction value In is smaller than the current instruction value $I_{n-1}$ (step S160). The current instruction value $I_{n-1}$ has been stored in the storage unit 90 in last-executed step S120 of the current value determining process. If it is judged as a result of judgment that the current instruction value In is smaller than the current instruction value $I_{n-1}$ (step S160: YES), i.e., if an instruction for decreasing the magnetic flux density has been inputted, the current value determining unit 70 selects the second function 92 and sets the function flag to a value of 2 (step S170). Next, the current value determining unit 70 determines a current correction quantity Ic based on the second function 92 (step S180). The method for determining the current correction quantity Ic in this case will be explained later. Next, the current value determining unit 70 advances the process to above step S210.

If it is judged as a result of judgment that the current instruction value In is larger than the current instruction value $I_{n-1}$ (step S160: NO), i.e., if an instruction for increasing the magnetic flux density has been inputted, the current value determining unit 70 selects the third function 93 and sets the function flag to a value of 3 (step S190). Next, the current value determining unit 70 determines a current correction quantity Ic based on the third function 93 (step S200). The method for determining the current correction quantity Ic in this case will be explained later. Thereafter, the current value determining unit 70 advances the process to above step S210.

Figure 5:
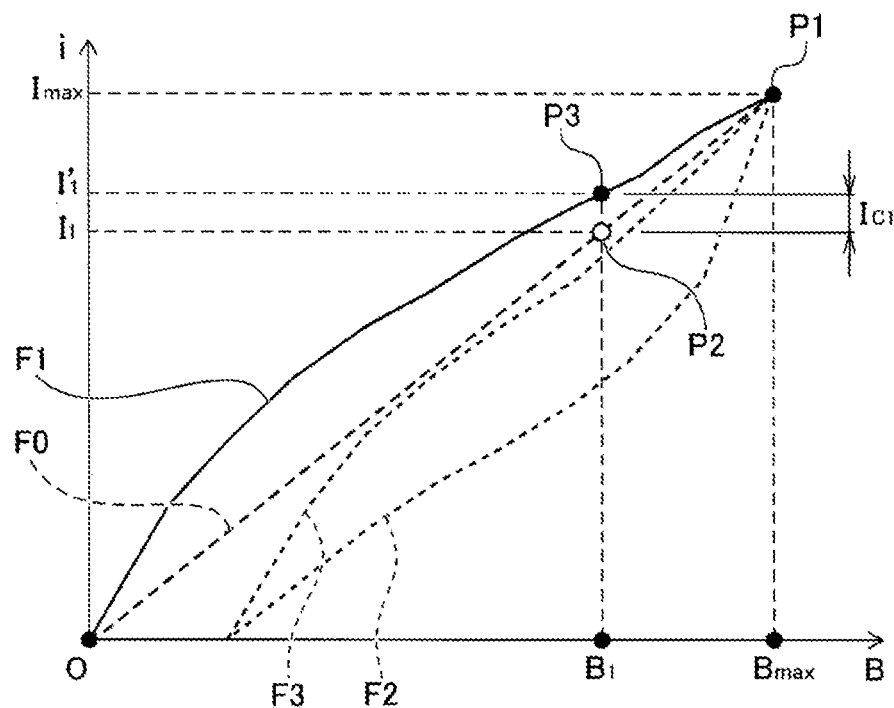
FIG. 5 is a schematic diagram showing a concept for determining a current value, in the case that magnetic flux density is to be increased from that in a demagnetization state.

FIGS. 5-8 show, in a conceptual manner, examples of methods for determining current correction quantities Ic in above steps S150, S180, and S200. FIG. 5 shows a concept for determining a current value in the case that magnetic flux density is to be increased from that in a demagnetization state. As shown in FIG. 5, when a magnetic flux density instruction value B1, that is smaller than the maximum value Bmax, is inputted, the electromagnet control device 50 calculates a current instruction value I1 by use of the ideal straight line F0 (step S110). In FIG. 5, point P1 is a point that is on the ideal straight line F0 and corresponds to the maximum value Bmax. Point P2 is a point that is on the ideal straight line F0, is determined based on the magnetic flux density instruction value B1, and corresponds to the current instruction value I1. Next, the electromagnet control device 50 determines a current correction quantity $I_{C1}$ by use of the first function 91 (step S150), and adds the current instruction value I1 thereto to calculate a controlled current value I'1. Point P3 is a point that is on the first function line F1 and corresponds to the magnetic flux density instruction value B1 and the controlled current value I'1. That is, in the case that the magnetic flux density is to be increased from that in the demagnetization state to the magnetic flux density instruction value B1, the current value is increased from zero to the controlled current value I'1 that corresponds to the point P3 on the first function line F1. In the first function 91, correspondence relation between the current instruction values I and the current correction quantities Ic is defined to be able to obtain a result such as that explained above.

Figure 6:
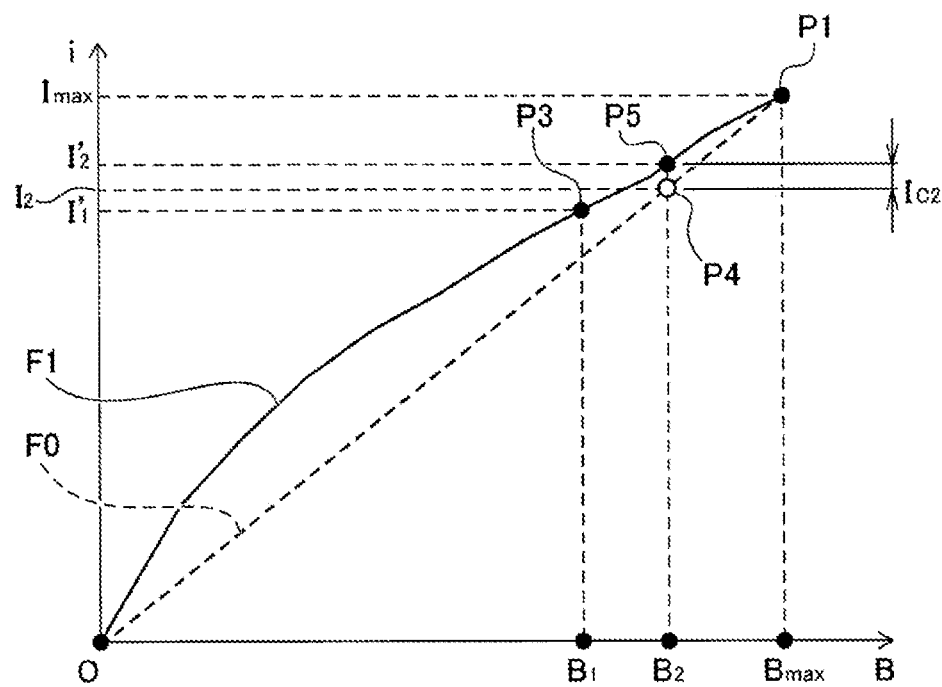
FIG. 6 is a schematic diagram showing a concept for determining a current value, in the case that magnetic flux density is to be increased further from that in the state in FIG. 5.

FIG. 6 shows a concept for determining a current value in the case that magnetic flux density is to be increased further from that in the state shown in FIG. 5. After a magnetic flux density instruction value B2 (B2>B1) is inputted, the electromagnet control device 50 calculates a current instruction value I2 (corresponding to point P4) by use of the ideal straight line F0 (step S110). Next, the electromagnet control device 50 determines a current correction quantity $I_{C2}$ by use of the first function 91 (step S150), and adds the current instruction value I2 thereto to calculate a controlled current value I'2 (corresponding to point P5). That is, as long as increasing of the inputted magnetic flux density instruction value from that in the demagnetization state is continued, the controlled current value I' is determined, by continuously using the first function 91, as a value corresponding to a point on the first function line F1. Whether or not the inputted magnetic flux density instruction value is continuously increased form that in the demagnetization state can be judged by referring to the function flag. Specifically, if a magnetic flux density instruction value larger than the last magnetic flux density instruction value is inputted under the state that the function flag has been set to a value of 1, it can be judged that the magnetic flux density instruction value to be inputted increases continuously from that in the demagnetization state.

Figure 7:
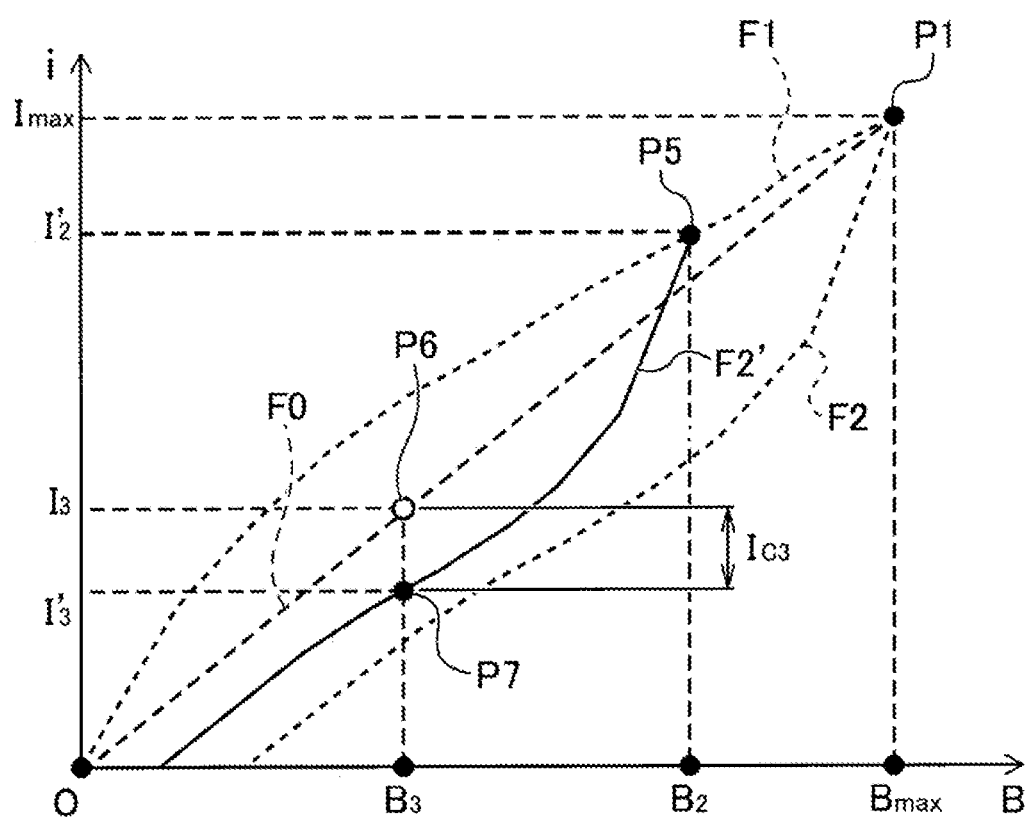
FIG. 7 is a schematic diagram showing a concept for determining a current value, in the case that magnetic flux density is to be decreased from that in a magnetization state.

FIG. 7 shows a concept for determining a current value in the case that magnetic flux density is to be decreased from that in the magnetization state. After a magnetic flux density instruction value B3 (B3<B2) is inputted under the state shown in FIG. 6, i.e., after the magnetic flux density instruction value is switched from that in an increasing state to that in a decreasing state, the electromagnet control device 50 calculates a current instruction value I3 (corresponding to point P6) by use of the ideal straight line F0 (step S110). Next, the electromagnet control device 50 determines a current correction quantity $I_{C3}$ by use of the second function 92 (step S150), and adds the current instruction value I3 thereto to calculate a controlled current value I'3 (corresponding to point P7). The point 7 is that on a second function transformed line F2'. Since the second function transformed line F2' is positioned below the ideal straight line F0, the current correction quantity $I_{C3}$ is calculated as a negative value.

The second function transformed line F2' is a line constructed by transforming the second function line F2. Specifically, the second function transformed line F2' is a line constructed by performing transformation to position it between the second function line F2 and the ideal straight line F0. For example, the second function transformed line F2' can be obtained by the process explained below. First, the second function line F2 is moved in a parallel direction in such a manner that the point P1 (the end point opposite to the origin in the second function line F2) is positioned at the position of the point P5 (a point on the first function line F1 corresponding to the magnetic flux density B1, when the magnetic flux density (in other words, the current) changes from that in an increasing state to that in a decreasing state). Thereafter, as shown in FIG. 7, the second function line F2 moved in the parallel direction is expanded or reduced. A method for determining a scaling ratio in this case will be explained later. The second function line F2 becomes, after completion of the above scale transformation, the second function transformed line F2'.

The current correction quantity $I_{C3}$ is determined in such a manner that the controlled current value I'3 positions on the second function transformed line F2' explained above. In other words, the second function 92 is used after it is converted to be able to obtain a result such as that explained above.

After the state shown in FIG. 7, and as long as the magnetic flux density instruction value to be inputted decreases continuously, the controlled current value I' is determined, by use of the same function (the above transformed second function 92), as a value corresponding to a point on the second function transformed line F2'. Whether or not the magnetic flux density instruction value to be inputted decreases continuously from that in the magnetization state can be judged by referring to the function flag. Specifically, if a magnetic flux density instruction value smaller than the last magnetic flux density instruction value is inputted under the state that the function flag has been set to a value of 2, it can be judged that the magnetic flux density instruction value to be inputted decreases continuously from that in the magnetization state. Note that, in the case that the magnetic flux density instruction value is switched from that in an increasing state to that in a decreasing state after the magnetic flux density instruction value has reached the point P1, the controlled current value I' is determined in such a manner that the controlled current value I' is positioned on the second function line F2 rather than the second function transformed line F2'.

Figure 8:
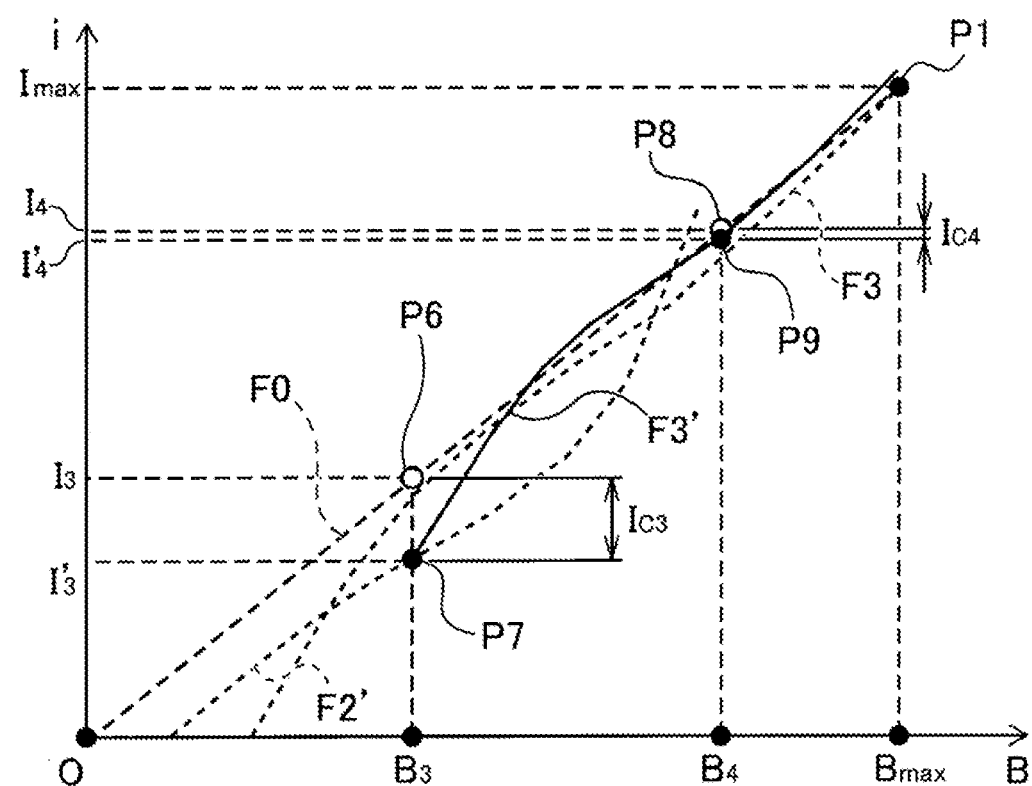
FIG. 8 is a schematic diagram showing a concept for determining a current value, in the case that magnetic flux density is to be increased from that in a magnetization state.

FIG. 8 shows a concept for determining a current value, in the case that magnetic flux density is to be increased from that in a magnetization state. After a magnetic flux density instruction value B4 (B4>B3) is inputted under the state shown in FIG. 7, i.e., after the magnetic flux density instruction value is switched again, under a magnetization state, from that in a decreasing state to that in an increasing state, the electromagnet control device 50 calculates a current instruction value I4 (corresponding to point P8) by use of the ideal straight line F0 (step S110). Whether or not the magnetic flux density instruction value is switched again, under a magnetization state, from that in a decreasing state to that in an increasing state can be judged by referring to the function flag. Specifically, if a magnetic flux density instruction value larger than the last magnetic flux density instruction value is inputted under the state that the function flag has been set to a value of 2, it can be judged that the magnetic flux density instruction value is switched again from that in a decreasing state to that in an increasing state, under the magnetization state.

Next, the electromagnet control device 50 determines a current correction quantity $I_{C4}$ by use of the third function 93 (step S150), and adds the current instruction value I4 thereto to calculate a controlled current value I'4 (corresponding to point P9). The point 9 is that on a third function transformed line F3'. Since the third function transformed line F3' is positioned below the ideal straight line F0, the current correction quantity $I_{C4}$ is calculated as a negative value.

The third function transformed line F3' is a line constructed by transforming the third function line F3. For example, the third function transformed line F3' can be obtained by the process explained below. First, the third function line F3 is moved in a parallel direction in such a manner that the end point, that is positioned at the side of the origin, of the third function line F3 is positioned at the position of the point P7 (a point on the second function transformed line F2', when the magnetic flux density (in other words, the current) is switched from that in a decreasing state to that in an increasing state). Thereafter, as shown in FIG. 8, the third function line F3 moved in the parallel direction is expanded or reduced. A method for determining a scaling ratio in this case will be explained later. The third function line F3 becomes, after completion of the above scale transformation, the third function transformed line F3'.

The current correction quantity $I_{C4}$ is determined in such a manner that the controlled current value I'4 is to be positioned on the third function transformed line F3' explained above. In other words, the third function 93 is used after it is converted to be able to obtain a result such as that explained above.

After the state shown in FIG. 8, and as long as the magnetic flux density instruction value to be inputted increases continuously in the magnetization state, the controlled current value I' is determined, by use of the same function (the above transformed third function 93), as a value corresponding to a point on the third function transformed line F3'. Whether or not the magnetic flux density instruction value increases continuously, in the magnetization state, can be judged by referring to the function flag. Specifically, if a magnetic flux density instruction value larger than the last magnetic flux density instruction value is inputted under the state that the function flag has been set to a value of 3, it can be judged that the magnetic flux density instruction value increases continuously in the magnetization state. Further, in the case that the magnetic flux density is switched again to that in a decreasing state (this can be judged based on the function flag), the controlled current value I' is determined in a manner similar to that shown in FIG. 7, i.e., in such a manner that the controlled current value I' is positioned on a line that is formed by transforming the second function line F2. Note that, in the case that the magnetic flux density instruction value is switched from that in a decreasing state to that in an increasing state after the magnetic flux density instruction value has reached the minimum value of the second function line F2 (a point on the x axis), the controlled current value I' is determined in such a manner that the controlled current value I' is positioned on the third function line F3 rather than the third function transformed line F3'. With respect to each of the second to fourth quadrants, although explanation will be omitted, the controlled current value I' is determined in a manner similar to that in the case of the first quadrant.

Figure 9:
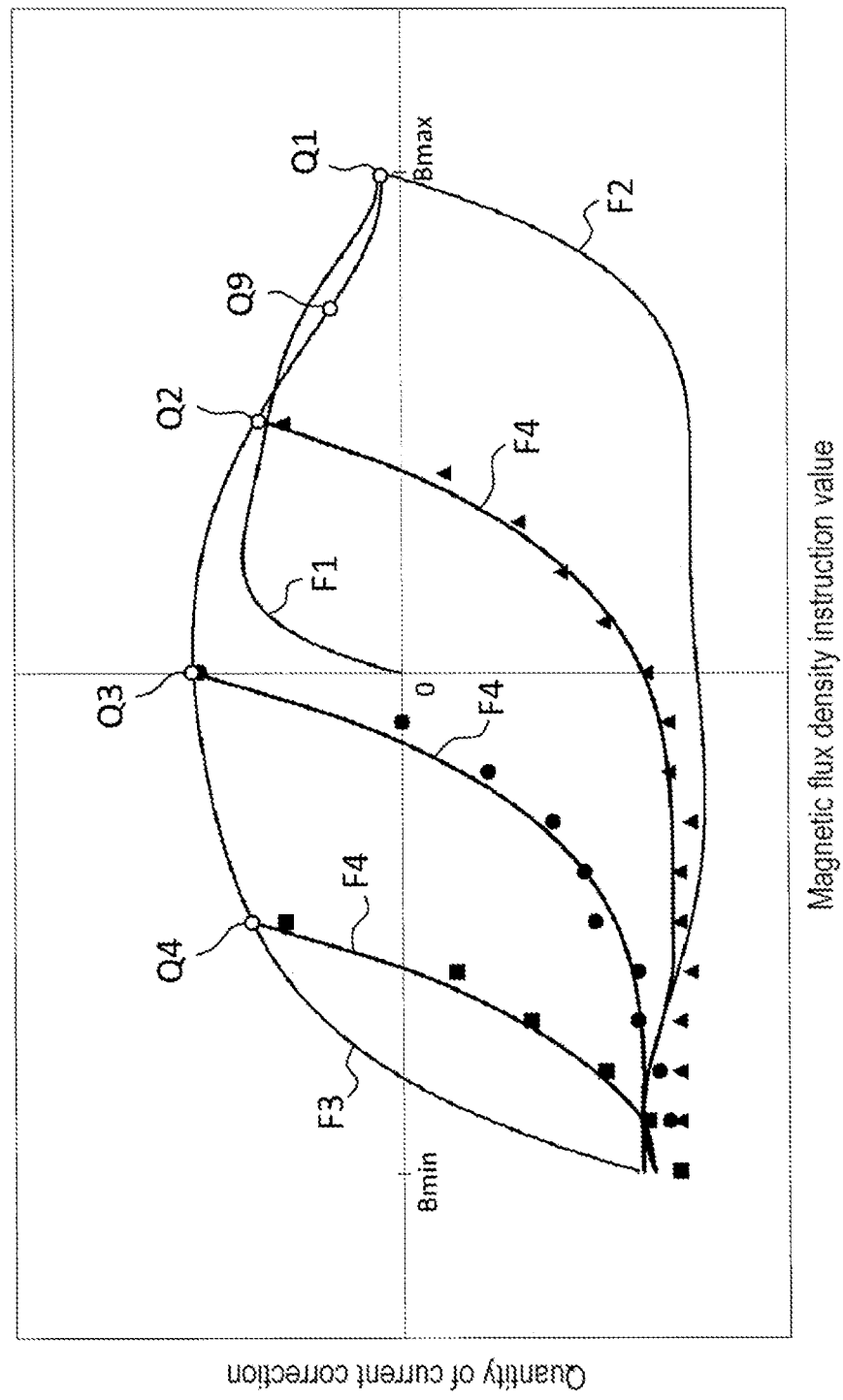
FIG. 9 is a schematic diagram which shows, in a conceptual manner, a method for determining a scaling ratio used when expanding or reducing a second function line F2.

FIG. 9 shows, in a conceptual manner, a tangible example of a method for determining a scaling ratio that is used when expanding or reducing the second function line F2 after it is moved in a parallel direction, for obtaining the second function transformed line F2' (hereinafter, this line will be described as the fourth function line F4). In FIG. 9, the horizontal axis represents magnetic flux density instruction values in a manner similar to those in FIGS. 5-8; however, unlike FIGS. 5-8, the vertical axis represents current correction quantities Ic.

Similar to the function lines F1-F3 explained above (FIG. 3 and so on), the first function line F1, the second function line F2, and the third function line F3 in FIG. 9 are those based on the first function 91, the second function 92, and the third function 93 stored in the storage unit 90 in advance, respectively. For example, the first function 91, the second function 92, and the third function 93 are defined as N-th order polynomial expressions (For example, N=5) or any other functions. Further, in FIG. 9, the first function line F1 is defined in a range between zero and a maximum value Bmax of magnetic flux density, and each of the second function line F2 and the third function line F3 is defined in a range between the maximum value Bmax and a minimum value Bmin (=−Bmax) of the magnetic flux density.

As explained above, in the case that the magnetic flux density instruction value is switched from that in an increasing state to that in a decreasing state after the magnetic flux density instruction value reaches the maximum value Bmax (a first magnetization state), the controlled current value I' is determined in accordance with the second function line F2. However, in the case that the magnetic flux density instruction value increases continuously and, then, the magnetic flux density instruction value is switched from that in an increasing state to that in a decreasing state under a predetermined magnetic flux density (a third magnetization state) that is smaller than the maximum value Bmax before the magnetic flux density instruction value reaches the maximum value Bmax, the controlled current value I' is determined in accordance with the fourth function line F4 that is constructed by transforming the second function line F2.

For transforming the second function line F2 to the fourth function line F4, measured data representing relationship between the magnetic flux density instruction values (or current instruction values I) and the current correction quantities Ic, in the case that the magnetic flux density instruction value is switched from that in an increasing state to that in a decreasing state at a point on the third function line F3 (for example, points Q2, Q3, Q4) corresponding to the third magnetization state, are obtained in advance. Some pieces of such measured data are plotted in FIG. 9.

First, the second function line F2 is moved in a parallel direction in such a manner that the point Q1 (the end point that corresponds to the first magnetization state and is on the second function line F2) is positioned at the point Q2 (or Q3, Q4) that corresponds to measured data that were obtained in advance as explained above. Next, a scaling ratio (a first scaling ratio) to be applied to the second function line F2 is determined in such a manner that the second function line F2 moved in the parallel direction fits measured data relating to the point Q2 (or Q3, Q4). By expanding or reducing the second function line F2 in accordance with the scaling ratio after parallel movement, the fourth function line F4 is obtained. Regarding the third magnetization state (the points Q2, Q3, Q4 on the third function line F3 in FIG. 9) with respect to which measured data have already been obtained, transformation from the second function line F2 to the fourth function line F4 can be performed by use of a method similar to the above method.

As explained above, the fourth function line F4 is obtained by expanding or reducing the second function line F2 by use of the scaling ratio that is based on measured data; thus, actual magnetic flux density, that is generated by a controlled current value I' that is determined in accordance with the fourth function line F4, can be made to coincide precisely with a magnetic flux density instruction value. Also, it is preferable to determine, in an independent manner, the scaling ratio for expanding or reducing the second function line F2 in the direction of the horizontal axis in FIG. 9 and the scaling ratio for expanding or reducing the second function line F2 in the direction of the vertical axis in FIG. 9. Then, by expanding or reducing the second function line F2 in the horizontal axis direction and the vertical axis direction in FIG. 9 in an independent manner, the second function line F2 can be made to fit actual data in a flexible manner.

Figure 10:
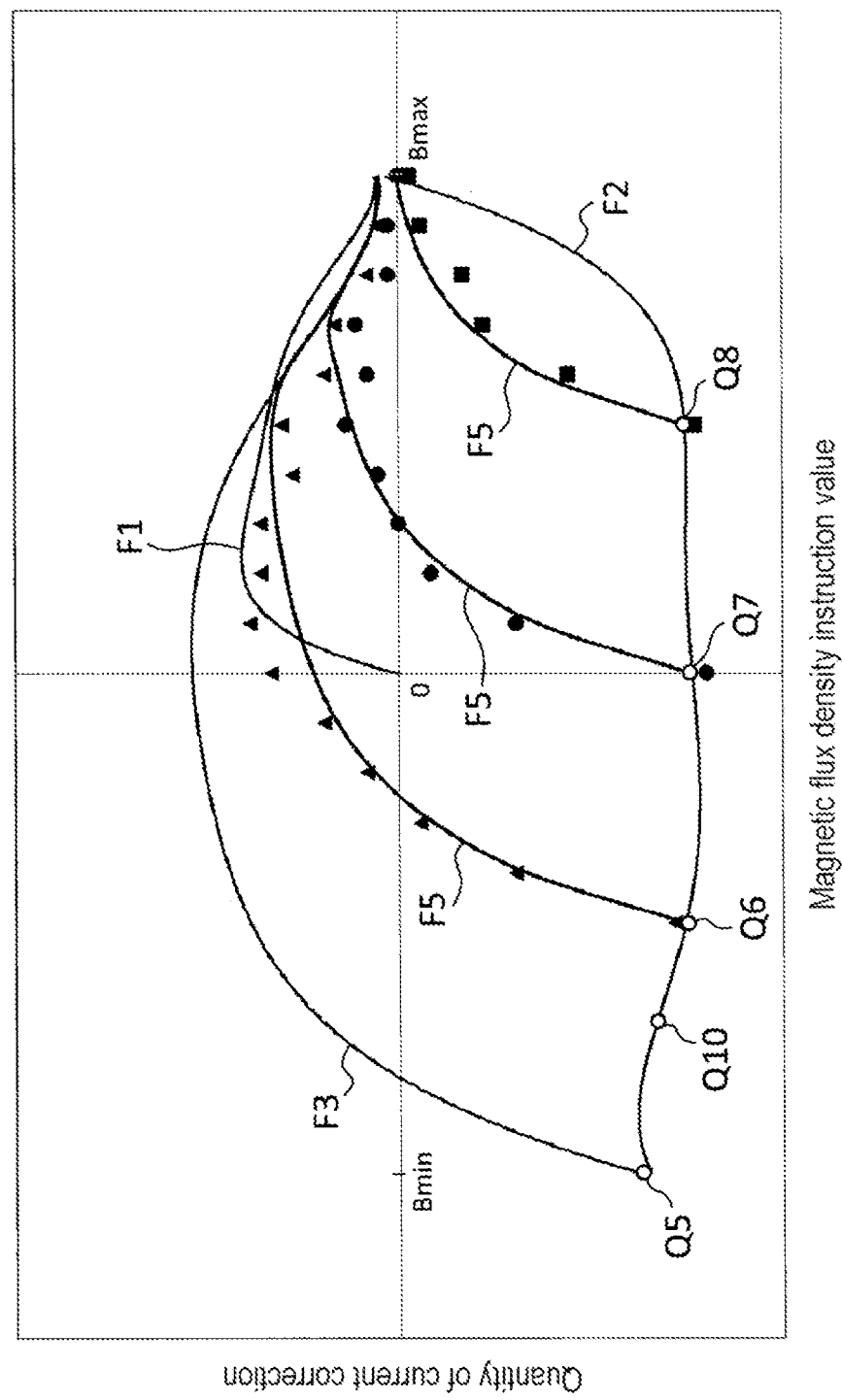
FIG. 10 is a schematic diagram which shows, in a conceptual manner, a method for determining a scaling ratio used when expanding or reducing a third function line F3.

FIG. 10 shows, in a conceptual manner, a tangible example of method for determining a scaling ratio that is used when expanding or reducing the third function line F3 after it is moved in a parallel direction, for obtaining the third function transformed line F3' (hereinafter, this line will be described as the fifth function line F5). It should be reminded that, in FIG. 10, the horizontal line and the vertical line represent magnetic flux density instruction values and current correction quantities Ic, respectively, in a manner similar to that in FIG. 9.

Similar to the case in FIG. 9, the first function line F1, the second function line F2, and the third function line F3 in FIG. 10 are those based on the first function 91, the second function 92, and the third function 93 stored in the storage unit 90 in advance, respectively. Further, in FIG. 10, the first function line F1 is defined in a range between zero and a maximum value Bmax of magnetic flux density, and each of the second function line F2 and the third function line F3 is defined in a range between the maximum value Bmax and a minimum value Bmin (=−Bmax) of the magnetic flux density.

As explained above, in the case that the magnetic flux density instruction value is switched from that in a decreasing state to that in an increasing state after the magnetic flux density instruction value reaches the minimum value Bmin (a second magnetization state), the controlled current value I' is determined in accordance with the third function line F3. However, in the case that the magnetic flux density instruction value decreases continuously and, then, the magnetic flux density instruction value is switched from that in a decreasing state to that in an increasing state under a predetermined magnetic flux density (a fourth magnetization state) larger than the minimum value Bmin before the magnetic flux density instruction value reaches the minimum value Bmin, the controlled current value I' is determined in accordance with the fifth function line F5 that is constructed by transforming the third function line F3.

For transforming the third function line F3 to the fifth function line F5, measured data representing relationship between the magnetic flux density instruction values (or current instruction values I) and the current correction quantities Ic, in the case that the magnetic flux density instruction value is switched from that in a decreasing state to that in an increasing state at a point on the second function line F2 (for example, points Q6, Q7, Q8) corresponding to the fourth magnetization state, are obtained in advance. Some pieces of such measured data are plotted in FIG. 10.

First, the third function line F3 is moved in a parallel direction in such a manner that the point Q5 (the end point that corresponds to the second magnetization state and is on the third function line F3) is positioned at the point Q6 (or Q7, Q8) that corresponds to measured data that were obtained in advance as explained above. Next, a scaling ratio (a second scaling ratio) to be applied to the third function line F3 is determined in such a manner that the third function line F3 moved in the parallel direction fits measured data relating to the point Q6 (or Q7, Q8). By expanding or reducing the third function line F3 in accordance with the scaling ratio after parallel movement, the fifth function line F5 is obtained. Regarding the fourth magnetization state (the points Q6, Q7, Q8 on the second function line F2 in FIG. 10) with respect to which measured data have already been obtained, transformation from the third function line F3 to the fifth function line F5 can be performed by use of a method similar to the above method.

As explained above, the fifth function line F5 is obtained by expanding or reducing the third function line F3 by use of the scaling ratio that is based on measured data; thus, actual magnetic flux density, that is generated by a controlled current value I' that is determined in accordance with the fifth function line F5, can be made to coincide precisely with a magnetic flux density instruction value. Also, it is preferable to determine, in an independent manner, the scaling ratio for expanding or reducing the third function line F3 in the direction of the horizontal axis in FIG. 10 and the scaling ratio for expanding or reducing the third function line F3 in the direction of the vertical axis in FIG. 10. Then, by expanding or reducing the third function line F3 in the horizontal axis direction and the vertical axis direction in FIG. 10 in an independent manner, the third function line F3 can be made to fit actual data in a flexible manner.

Figure 11:
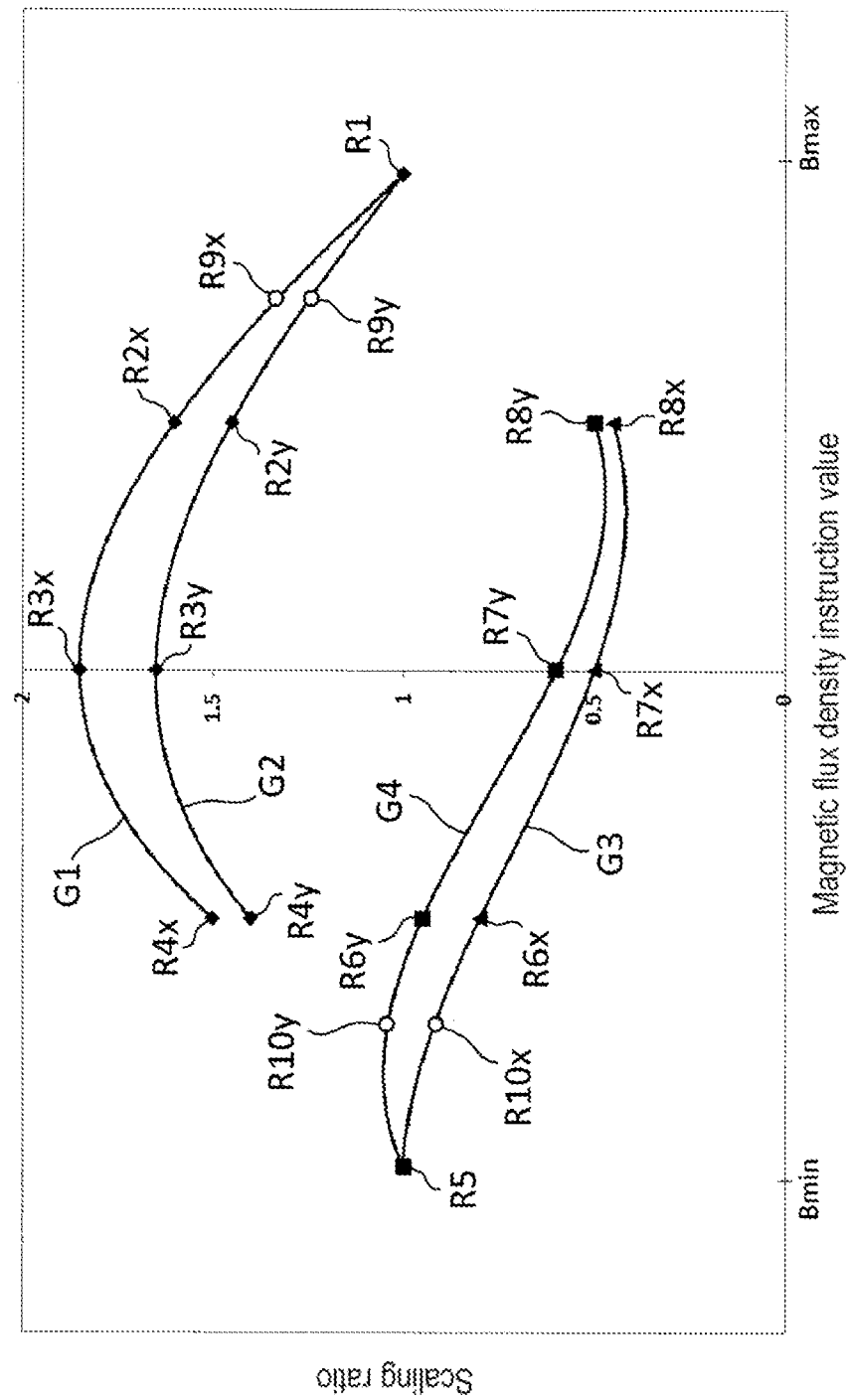
FIG. 11 is a schematic diagram which shows, in a conceptual manner, a method for determining a scaling ratio, in the case that the state of a magnetic flux density instruction value is switched between an increase state and a decrease state, under a magnetization state with respect to which no measured datum exists.

FIG. 11 shows, in a conceptual manner, a tangible example of a method for determining a scaling ratio, in the case that increase/decrease regarding a magnetic flux density instruction value is switched under a magnetization state with respect to which no measured datum exists. In FIG. 11, the horizontal axis represents magnetic flux density instruction values, and the vertical axis represents scaling ratios for use in scale conversion of function lines.

In FIG. 11, the first scaling ratios and the second scaling ratios, that are determined in accordance with the methods shown in FIGS. 9 and 10, are plotted. Specifically, points R2x, R3x, and R4x in FIG. 11 represent the first scaling ratios, that are determined with respect to the points Q2, Q3, and Q4 in FIG. 9, respectively, and used for expanding or reducing the second function line F2 in the direction of the horizontal axis in FIG. 9; and points R2y, R3y, and R4y in FIG. 11 represent the first scaling ratios, that are determined with respect to the points Q2, Q3, and Q4 in FIG. 9, respectively, and used for expanding or reducing the second function line F2 in the direction of the vertical axis in FIG. 9. Further, points R6x, R7x, and R8x in FIG. 11 represent the second scaling ratios, that are determined with respect to the points Q6, Q7, and Q8 in FIG. 10, respectively, and used for expanding or reducing the third function line F3 in the direction of the horizontal axis in FIG. 10; and points R6y, R7y, and R8y in FIG. 11 represent the second scaling ratios, that are determined with respect to the points Q6, Q7, and Q8 in FIG. 10, respectively, and used for expanding or reducing the third function line F3 in the direction of the vertical axis in FIG. 10. Still Further, points R1 and R5 in FIG. 11 correspond to the point Q1 in FIG. 9 and point Q5 in FIG. 10, respectively, and show that each scaling ratio thereof is 1 (that is, the second function line F2 and the third function line F3 are used as they stand).

In FIG. 9, the point Q9 on the third function line F3 represents a fifth magnetization state, with respect to which measured data such as those relating to the point Q2, the point Q3, and the point Q4 do not exist. Thus, in the case that a magnetic flux density instruction value is switched from that in an increasing state to that in a decreasing state at the point Q9 explained above, it is not possible to determine, in accordance with the above-explained method shown in FIG. 9, a scaling ratio of the second function line F2. For obtaining a scaling ratio corresponding to the point Q9, an approximate curve G1 that is the closest to the set of point R1, the point R2x, the point R3x, and the point R4x, and an approximate curve G2 that is the closest to the set of point R1, the point R2y, the point R3y, and the point R4y in FIG. 11 are used. A scaling ratio corresponding to the point R9x on the approximate curve G1 (the point whereat the point Q9 in FIG. 9 and the magnetic flux density instruction value coincide with each other) is adopted as the scaling ratio (a third scaling ratio) for expanding or reducing the second function line F2 in the direction of the horizontal axis in FIG. 9; and a scaling ratio corresponding to the point R9y on the approximate curve G2 (the point whereat the point Q9 in FIG. 9 and the magnetic flux density instruction value coincide with each other) is adopted as the scaling ratio (a third scaling ratio) for expanding or reducing the second function line F2 in the direction of the vertical axis in FIG. 9. By expanding or reducing the second function line F2 (after parallel movement) by use of the thus determined third scaling ratios, the second function line F2 is transformed to a sixth function line, and, after this transformation, a controlled current value I' is determined in accordance with the sixth function line.

Similarly, in FIG. 10, the point Q10 on the second function line F2 represents a sixth magnetization state, with respect to which measured data such as those relating to the point Q6, the point Q7, and the point Q8 do not exist. Thus, in the case that a magnetic flux density instruction value is switched from that in a decreasing state to that in an increasing state at the point Q10 explained above, it is not possible to determine, in accordance with the above-explained method shown in FIG. 10, a scaling ratio of the third function line F3. For obtaining a scaling ratio corresponding to the point Q10, an approximate curve G3 that is the closest to the set of point R5, the point R6x, the point R7x, and the point R8x, and an approximate curve G4 that is the closest to the set of point R5, the point R6y, the point R7y, and the point R8y in FIG. 11 are used. A scaling ratio corresponding to the point R10x on the approximate curve G3 (the point whereat the point Q10 in FIG. 10 and the magnetic flux density instruction value coincide with each other) is adopted as the scaling ratio (a fourth scaling ratio) for expanding or reducing the third function line F3 in the direction of the horizontal axis in FIG. 10; and a scaling ratio corresponding to the point R10y on the approximate curve G4 (the point whereat the point Q10 in FIG. 10 and the magnetic flux density instruction value coincide with each other) is adopted as the scaling ratio (a fourth scaling ratio) for expanding or reducing the third function line F3 in the direction of the vertical axis in FIG. 10. By expanding or reducing the third function line F3 (after parallel movement) by use of the thus determined fourth scaling ratios, the third function line F3 is transformed to a seventh function line, and, after this transformation, a controlled current value I' is determined in accordance with the seventh function line.

In the manner explained above, plural scaling ratios that have been determined with respect to magnetization states, for which measured data have been obtained in advance, are interpolated by use of an approximate curve, so as to obtain a scaling ratio with respect to a magnetization state, for which no measured datum exists; thus, it is not required to perform, for every magnetization state, work for switching between a magnetic flux density instruction value in an increase state and that in a decrease state and obtaining measured data, and it becomes possible to appropriately expand or reduce a function line, even if the state of the magnetic flux density instruction value is switched under any magnetization state. As a result, a magnetic flux density instruction value and actually obtained magnetic flux density can be made to coincide with each other precisely, over the whole range of the magnetic flux density.

In accordance with the matters explained above, the controlled current value I', that is obtained by taking hysteresis of the electromagnet 40 into consideration, is determined by the current value determining unit 70 and outputted to the driver 80 (step S230 in FIG. 4). The driver 80 applies, in accordance with the controlled current value I', current having a predetermined waveform to the coil 41 of the electromagnet 40. For example, the waveform of the current outputted from the driver 80 may be designed to have a step waveform or a ramp waveform.

Figure 12:
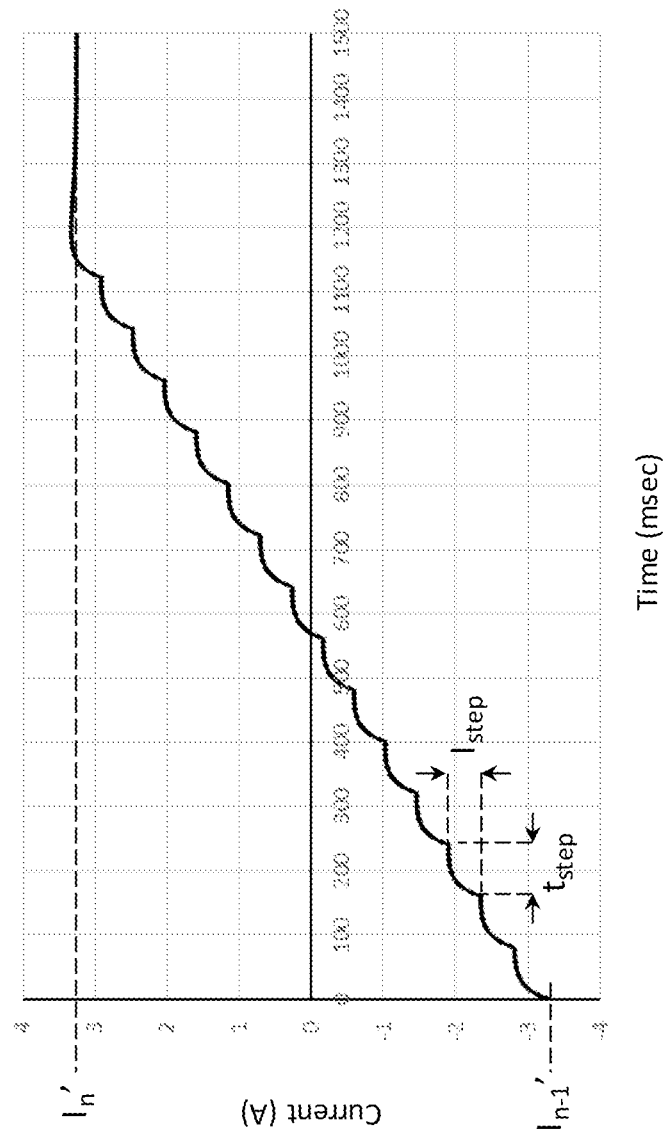
FIG. 12 is a figure showing an example of step-waveform current outputted from a driver.

FIG. 12 is a figure showing an example of current having a step-waveform and outputted from the driver 80. In FIG. 12, the horizontal axis represents time and the vertical axis represents current. After a controlled current value In' (i.e., the controlled current value determined with respect to the n-th magnetic flux density instruction value) is indicated from the current value determining unit 70 to the driver 80, the driver 80 changes its output current in a stepwise manner, specifically, by a step width $I_{step}$ per time interval $T_{step}$, from the present current value $I_{n-1}$' (i.e., the controlled current value determined in the last current value determining process with respect to the (n−1)th magnetic flux density instruction value) to finally output current having the target current value In', as shown in the figure. FIG. 12 shows the case wherein In'>$I_{n-1}$', i.e., a step waveform representing increase of current; however, it is a matter of course that, in the case that In'<$I_{n-1}$', the waveform becomes a step waveform representing decrease of current. Further, although the current changes from $I_{n-1}$' to In' through 15 steps in the example in FIG. 12, the number of steps is that determined based on the difference between the initial value $I_{n-1}$' and the final value In' of the current and the step width $I_{step}$ of the current. It should be reminded that it is preferable that the time interval $t_{step}$ be set to have length that allows a next step interval to start after the current, that has changed in each step interval, is stabilized.

Next, a preferred value of the step width $I_{step}$ of the current will be explained.

Figure 13A:
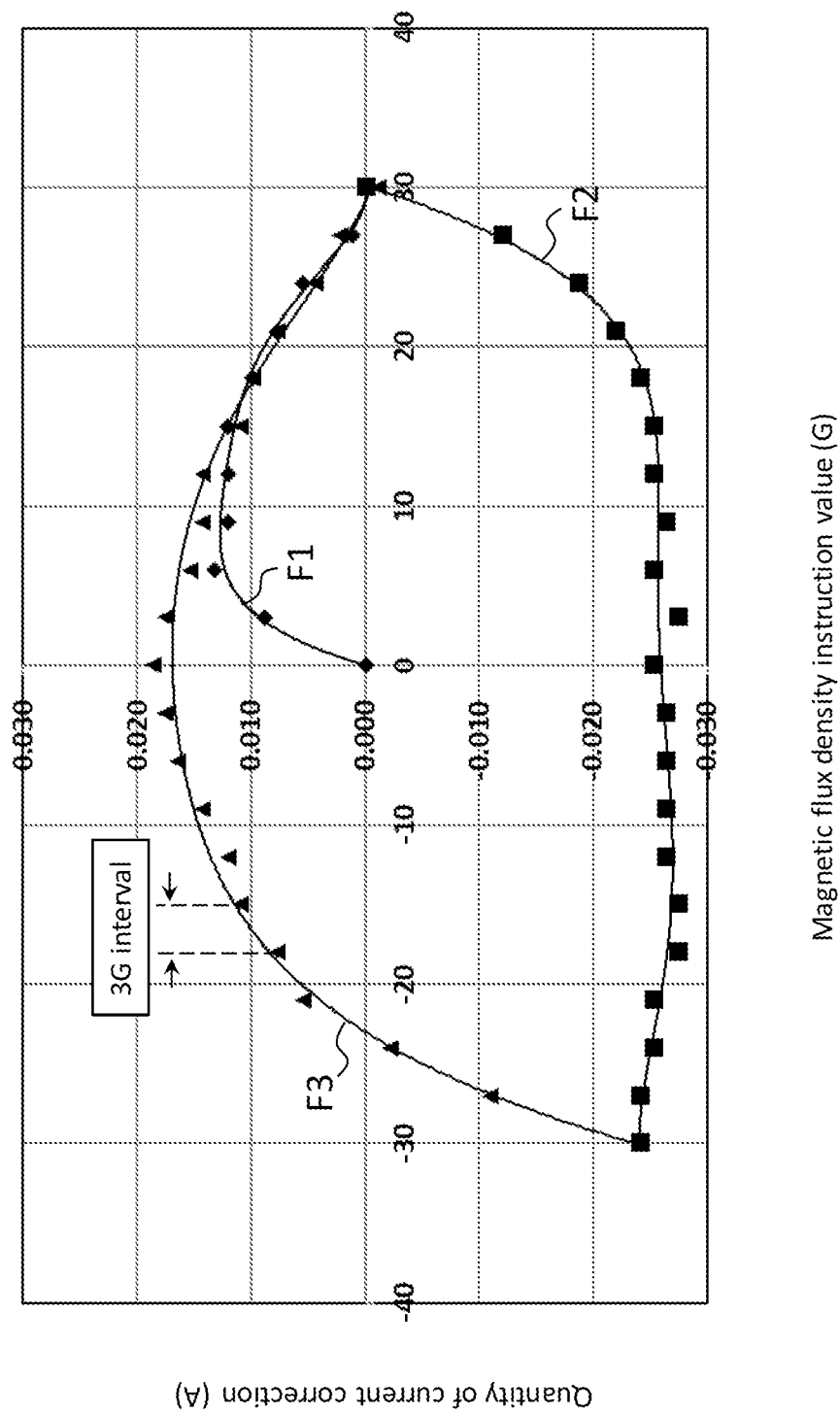
FIG. 13A is an example of data representing measured hysteresis of an electromagnet.

FIG. 13A is an example of data representing measured hysteresis of the electromagnet 40, that is shown in such a manner that it represents correspondence between the magnetic flux density instruction values B and the current correction quantities Ic. In FIG. 13A, in addition to a plot of measured data, a first function line F1, a second function line F2, and a third function line F3, that are curves constructed by performing polynomial approximation using the measured data, are shown. The magnetic flux density instruction values are those in a range from the minimum value Bmin=−30G (gauss) to the maximum value Bmax=+30G. In the example of FIG. 13A, the interval between the magnetic flux density instruction values is set to 3G, and data are measured.

The following evaluation experiment was performed for determining a preferable value of the step width $I_{step}$ of the current. First, the first function 91, the second function 92, and the third function 93, that are based on the measured data in FIG. 13A, are stored in the storage unit 90. Then, plural random magnetic flux density instruction values in the range from Bmin to Bmax are inputted serially from the instruction unit 22 to the electromagnet control device 50. With respect to each inputted magnetic flux density instruction value, the above-explained current value determining process in the flow chart in FIG. 4 is applied thereto, and a controlled current value I' is determined. In accordance with each determined controlled current value I', the driver 80 is made to output current having a step waveform. A deviation ΔB between the actual magnetic flux density, which is generated as a result of the above operation by the electromagnet 40, and the magnetic flux density instruction value is measured. The step width $I_{step}$ of the current, that has a step waveform and is outputted from the driver 80, is set in such a manner that the step widths converted to magnetic flux densities in specific cases become 1G, 3G, 6G, and 9G, respectively; and, regarding the respective cases, comparison with respect to dispersion of deviations ΔB is performed.

FIG. 14 shows result of comparison. According thereto, it can be understood that, in the case that the step width $I_{step}$ of the step-waveform current outputted from the driver 80 is a step width corresponding to 3G that is representation of the step width converted to a magnetic flux density, 3σ (σ is a standard deviation) that is an index of dispersion of deviations ΔB of the magnetic flux density generated by electromagnet 40 becomes the smallest. Thus, by applying step-waveform current having such a step width $I_{step}$ from the driver 80 to the coil 41 of the electro magnet 40, a magnetic flux density instruction value and a magnetic flux density that is actually generated by the electromagnet 40 can be made to coincide with each other more precisely.

Figure 13B:
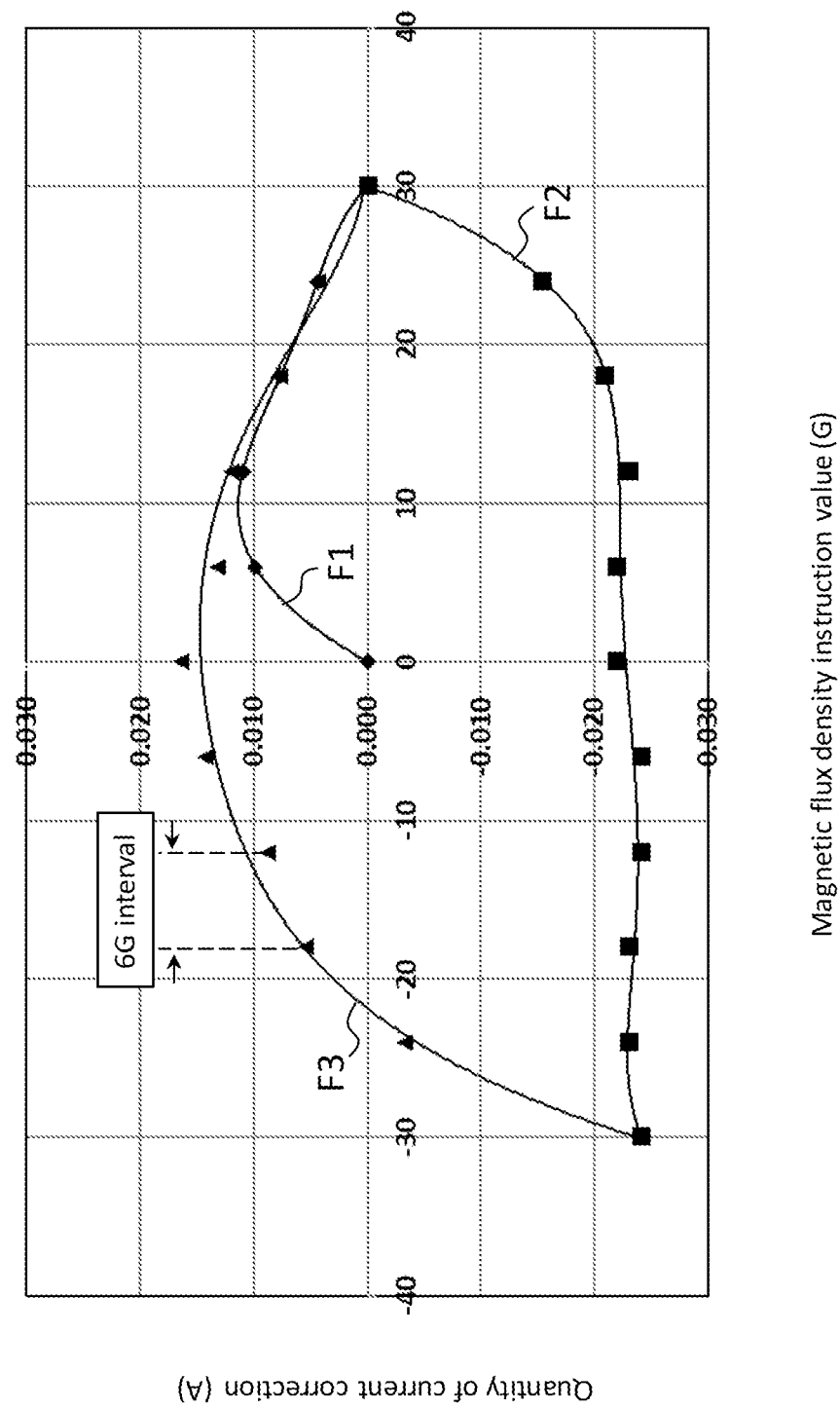
FIG. 13B is an example of data representing measured hysteresis of an electromagnet.
Figure 13C:
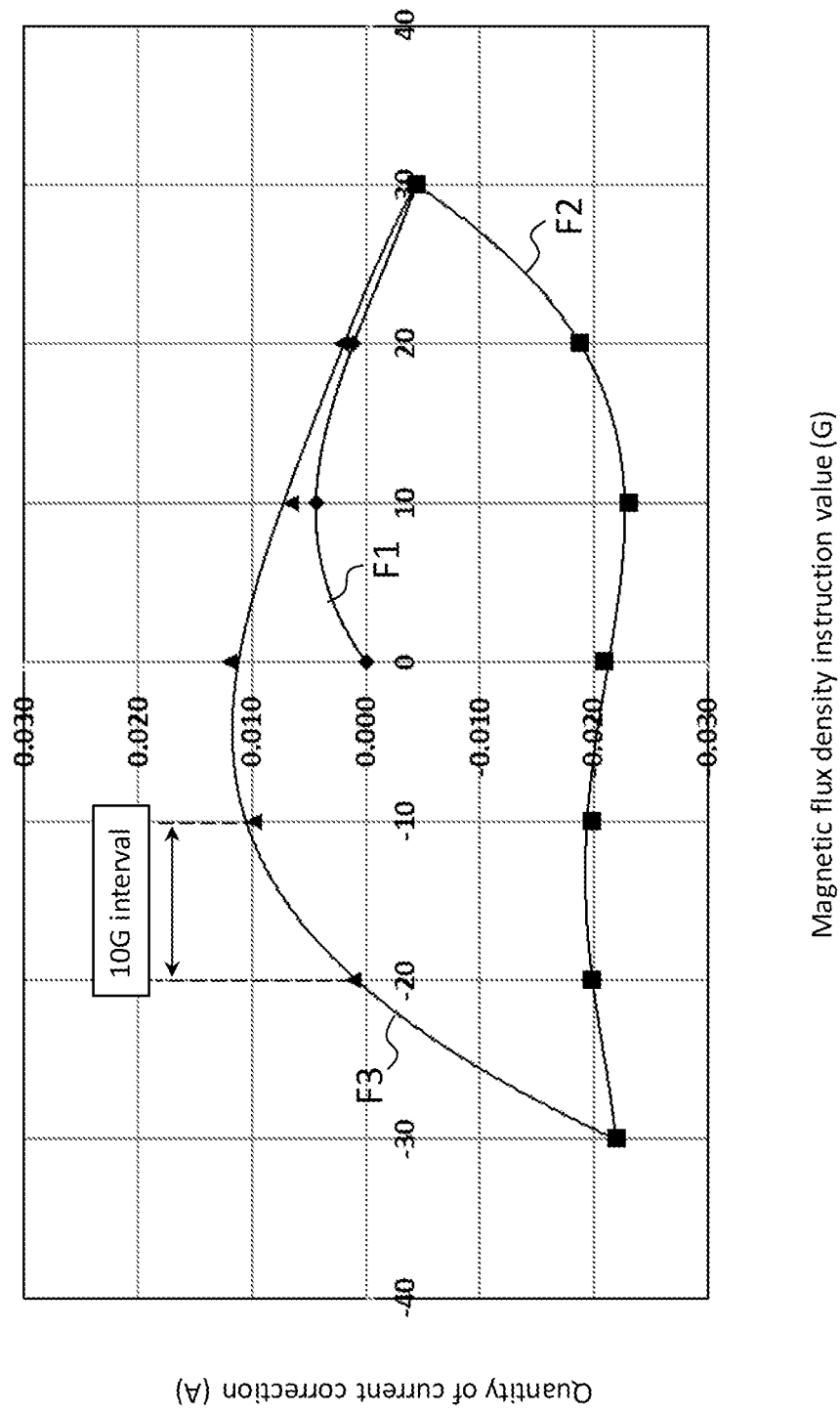
FIG. 13C is an example of data representing measured hysteresis of an electromagnet.

FIGS. 13B and 13C are those similar to FIG. 13A and showing examples of data of measured hysteresis of the electromagnet 40, wherein the intervals between magnetic flux density instruction values during data measurement are set to 6G and 10G, respectively. Evaluation experiment similar to the above-explained evaluation experiment relating to FIG. 13A is performed in relation to measured data shown in each of FIGS. 13b and 13C, and comparison with respect to dispersion of ΔBs is performed. Result of comparison is shown in FIG. 14. According thereto, it can be understood that, in the case that the interval between magnetic flux density instruction values, when obtaining measured data of hysteresis, is set to 6G, and that the step width $I_{step}$ of the current outputted from the driver 80 is set to a step width corresponding to 6G that is representation of the step width converted to magnetic flux density, dispersion 3σ of deviations ΔB of the magnetic flux density generated by electromagnet 40 becomes the smallest. Also, in the case that the interval between magnetic flux density instruction values, when obtaining measured data of hysteresis, is set to 10G, and with respect to the step width $I_{step}$ of the output current of the driver 80 that corresponds to 9G that is representation of the step width converted to magnetic flux density, dispersion 3σ of deviations ΔB of the magnetic flux density becomes the smallest.

When result of the above evaluation experiment is summarized, it is found that it is preferable that the step width $I_{step}$ of the step-waveform current outputted from the driver 80 to the electromagnet 40 be set in such a manner that the step width converted to a magnetic flux density from the step width $I_{step}$ is equal to or close to the interval between magnetic flux density instruction values at the time when measured data of hysteresis of the electromagnet 40 is obtained. Then, the magnetic flux density instruction value and the magnetic flux density that is actually generated by the electromagnet 40 can be made to coincide with each other more precisely.

Figure 15:
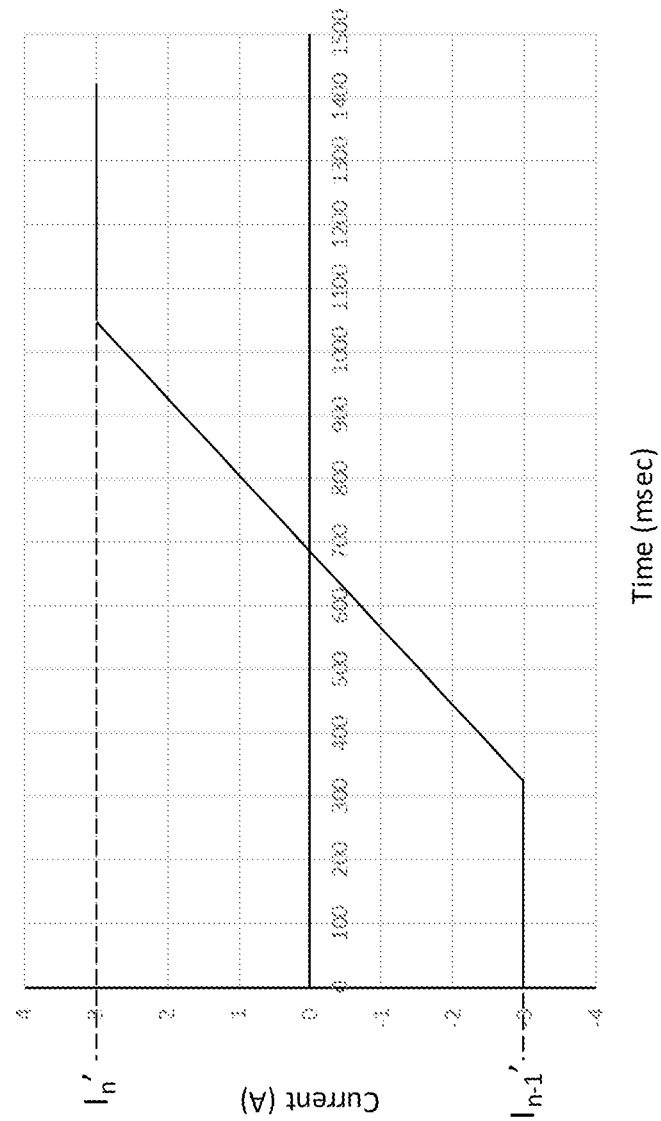
FIG. 15 is a figure showing an example of ramp-waveform current outputted from a driver.

FIG. 15 is a figure showing an example of ramp-waveform current outputted from the driver 80. In FIG. 15, the horizontal axis represents time and the vertical axis represents current. After a controlled current value In' (i.e., the controlled current value determined with respect to the n-th magnetic flux density instruction value) is indicated from the current value determining unit 70 to the driver 80, the driver 80 changes its output current in a continuous manner, specifically, with a predetermined constant rate of change, from the present current value $I_{n-1}'$ (i.e., the controlled current value determined in the last current value determining process with respect to the (n–1)th magnetic flux density instruction value) to finally output current having the target current value In', as shown in the figure. In this embodiment, the rate of change of current is defined by transition time $t_{trans}$ per 1 A of current. FIG. 15 shows the case wherein In'>$I_{n-1}'$, i.e., a ramp waveform representing increase of current; however, it is a matter of course that, in the case that In'<$I_{n-1}'$, the waveform becomes a ramp waveform representing decrease of current.

Evaluation experiment similar to the above-explained evaluation experiment performed in relation to the step waveform was performed, for determining a preferable value of the transition time $t_{trans}$ per unit current relating to the ramp waveform. In this embodiment, it is set that $T_{trans}$=30, 40, 50, 60, 70, 80, 90, and 100 ms/A, and measured data of hysteresis of the electromagnet 40 are obtained; and, regarding the respective cases, comparison of dispersion of deviations ΔB between the magnetic flux density instruction values and the magnetic flux densities, that are actually generated by the electromagnet 40, is performed in a manner similar to that in the case of the step waveform.

FIG. 16 shows result of comparison. According thereto, dispersion 3σ of deviations ΔB of the magnetic flux density becomes smaller as the transition time $t_{trans}$ per unit current becomes longer, i.e., as change of the output current in terms of time becomes slower. Thus, by applying ramp waveform current having such transition time $t_{trans}$ per unit current from the driver 80 to the coil 41 of the electromagnet 40, a magnetic flux density instruction value and a magnetic flux density that is actually generated by the electromagnet 40 can be made to coincide with each other more precisely.

According to the above-explained plasma processing system 20, the three functions 91, 92, and 93 are used differently according to history of application of current to the coil 41, to thereby control current that is made to flow through the coil 41; so that effect of a residual magnetism due to hysteresis can be reduced, regardless of history of application of current. That is, a magnetic flux density instruction value and a magnetic flux density value, that is actually obtained by making current flow through the coil, can be made to coincide with each other more precisely, compared with the case in prior art. As a result, reproducibility with respect to a condition of use of a process, when a same plasma processing system 20 is used, can be improved, and individual differences between plasma processing systems 20 having the same specifications can be reduced. Further, a magnetic flux density instruction value and an actually obtained magnetic flux density value can be made to coincide precisely with each other, regardless of the magnitude of hysteresis that the yoke 42 has. Thus, it is not required to use, as a material of the yoke 42, a material having small hysteresis. Accordingly, a material, which can be easily obtained and is inexpensive, can be used as a material of the yoke 42. That is, costs relating to the plasma processing system 20, and time required from the point in time when the plasma processing system 20 is ordered to the point in time when the plasma processing system 20 is delivered can be reduced.

B: Examples of Modification

In the above-explained plasma processing system 20, the instruction value inputted from the outside (the instruction unit 22 in the present embodiment) is not limited to a magnetic flux density instruction value. For example, a magnetic flux density instruction value may be converted, in the instruction unit 22, to a current instruction value I, and the current instruction value I may be inputted to the instruction value obtaining unit 60. The information obtained by the instruction value obtaining unit 60 may be any information by use of which a magnetic flux density instruction value can be specified.

Also, the functions 91, 92, and 93 are not limited to functions representing relationship between magnetic flux density instruction values B (or current instruction values I) and current correction quantities Ic. The functions 91, 92, and 93 may be functions representing relationship between any parameters by which controlled current values I' corresponding to magnetic flux density instruction values can be finally derived. For example, the functions 91, 92, and 93 may represent relationship between magnetic flux density and voltages. Alternatively, the functions 91, 92, and 93 may be functions representing relationship between magnetic flux density and current. Alternatively, the functions 91, 92, and 93 may be functions representing relationship between magnetic flux density instruction values and controlled current values I'. As explained above, by using functions by which magnetic flux densities and voltages are related to each other, a controlled current value I' can be directly determined from a desired magnetic flux density, without necessity to perform conversion to other parameters. Accordingly, the load for computing in the electromagnet control device 50 can be reduced.

In the above description, some embodiments of the present invention are explained; and the above embodiments of the present invention are those used for facilitating understanding of the present invention, and are not those for limiting the present invention. It is obvious that the present invention can be changed or modified without departing from the scope of the gist thereof, and that the scope of the present invention includes equivalents thereof. Further, it is possible to arbitrarily combine components or omit a component (components) disclosed in the claims and the specification, within the scope that at least part of the above-stated problems can be solved and/or within the scope that at least part of advantageous effect can be obtained.

REFERENCE SIGNS LIST

20 Plasma processing system
21 Plasma etching device
22 Instruction unit
30 Electromagnet system 40 Electromagnet
41 Coil
42 Yoke
50 Electromagnet control device
60 Instruction value obtaining unit
70 Current value determining unit
80 Driver
85 Demagnetization unit
90 Storage unit
91 First function
92 Second function
93 Third function

What is claimed is:

1. An electromagnet control device for controlling current flowing through a coil of an electromagnet, which comprises a yoke and the coil, comprising:
an instruction value obtaining unit constructed for obtaining a magnetic flux density instruction value corresponding to a target value of magnetic flux density that is obtained by making current flow through the coil, or obtaining information by which the magnetic flux density instruction value can be specified; and
a current value determining unit for determining, based on the magnetic flux density instruction value, a value of current that is made to flow through the coil: wherein
the current value determining unit is constructed to execute
a first process for determining, based on a first function, a value of current that is made to flow through the coil, in the case that the magnetic flux density is to be increased from that when the yoke is in a demagnetization state;
a second process for determining, based on a second function, a value of current that is made to flow through the coil, in the case that the magnetic flux density is to be decreased from that when the yoke is in a first magnetization state;
a third process for determining, based on a third function, a value of current that is made to flow through the coil, in the case that the magnetic flux density is to be increased from that when the yoke is in a second magnetization state;
a fourth process for expanding or reducing the second function by use of a first scaling ratio for transforming it to a fourth function, and determining, based on the fourth function obtained after above transformation, a value of current that is made to flow through the coil, in the case that the magnetic flux density is to be decreased from that when the yoke is in a third magnetization state; and
a fifth process for expanding or reducing the third function by use of a second scaling ratio for transforming it to a fifth function, and determining, based on the fifth function obtained after above transformation, a value of current that is made to flow through the coil, in the case that the magnetic flux density is to be increased from that when the yoke is in a fourth magnetization state; and the current value determining unit is constructed to
determine, in the fourth process, the first scaling ratio in such a manner that the second function fits a first set of measured data, the first set of measured data are obtained in advance by decreasing the magnetic flux density from that in the third magnetization state; and
determine, in the fifth process, the second scaling ratio in such a manner that the third function fits a second set of measured data, the second set of measured data are obtained in advance by increasing the magnetic flux density from that in the fourth magnetization state.

2. The electromagnet control device according to claim 1, wherein the first function, the second function, and the third functions are functions representing relationship between magnetic flux density and current.

3. The electromagnet control device according to claim 1, wherein
the current value determining unit is constructed to perform
a sixth process, that is performed in the case that the magnetic flux density is to be decreased from that when the yoke is in a fifth magnetization state, for determining plural scaling ratios corresponding to the plural magnetization states, respectively, in such a manner that the second function fits the respective measured data, wherein the respective measured data are obtained in advance by decreasing the magnetic flux density from that when the yoke is in the respective magnetization states in the plural magnetization states; determining a third scaling ratio by performing approximation using the plural scaling ratios; transforming the second function to a sixth function by expanding or reducing the second function by use of the third scaling ratio; and determining, based on the sixth function obtained after above transformation, a value of current that is made to flow through the coil; and
a seventh process, that is performed in the case that the magnetic flux density is to be increased from that when the yoke is in a sixth magnetization state, for determining plural scaling ratios corresponding to the plural magnetization states, respectively, in such a manner that the third function fits the respective measured data, wherein the respective measured data are obtained in advance by increasing the magnetic flux density from that when the yoke is in the respective magnetization states in the plural magnetization states; determining a fourth scaling ratio by performing approximation using the plural scaling ratios; transforming the third function to a seventh function by expanding or reducing the third function by use of the fourth scaling ratio; and determining, based on the seventh function obtained after above transformation, a value of current that is made to flow through the coil.

4. An electromagnet system comprising:
the electromagnet control device according to claim 1, and
the electromagnet.

* * * * *